United States Patent [19]
Choquette et al.

[11] Patent Number: 5,493,577
[45] Date of Patent: Feb. 20, 1996

[54] EFFICIENT SEMICONDUCTOR LIGHT-EMITTING DEVICE AND METHOD

[75] Inventors: Kent D. Choquette; Kevin L. Lear; Richard P. Schneider, Jr., all of Albuquerque, N.M.

[73] Assignee: Sandia Corporation, Albuquerque, N.M.

[21] Appl. No.: 361,252

[22] Filed: Dec. 21, 1994

[51] Int. Cl.$^6$ .................................................. H01S 3/085
[52] U.S. Cl. .................. 372/46; 372/45; 372/96; 372/99
[58] Field of Search .................. 372/46, 96, 99, 372/45, 92

[56] References Cited

U.S. PATENT DOCUMENTS

| | | | |
|---|---|---|---|
| 5,115,441 | 5/1992 | Kopf et al. | 372/99 |
| 5,258,316 | 11/1993 | Ackley et al. | 372/45 |
| 5,258,990 | 11/1993 | Olbright et al. | 372/96 |
| 5,262,360 | 11/1993 | Holonyak | 437/237 |
| 5,327,448 | 7/1994 | Holonyak | 372/94 |
| 5,331,654 | 7/1994 | Jewell et al. | 372/45 |
| 5,331,658 | 7/1994 | Shieh et al. | 372/92 |
| 5,337,327 | 8/1994 | Ackley | 372/45 |
| 5,343,487 | 8/1994 | Scott et al. | 372/46 |
| 5,353,295 | 10/1994 | Holonyak | 372/50 |
| 5,359,618 | 10/1994 | Lebby | 372/45 |

OTHER PUBLICATIONS

Y. H. Lee, B. Tell, K. Brown-Goebeler, J. L. Jewell, and J. V. Hove, "Top-Surface-Emitting GaAs Four-Quantum-Well Lasers Emitting at 0.85 μm," *Electronics Letters*, vol. 26, pp. 710–711, May 24, 1990.

J. M. Dallesasse and N. Holonyak, Jr., "Native-Oxide Stripe-Geometry $Al_xGa_{1-x}As$-GaAs Quantum-Well Heterostructure Lasers," *Applied Physics Letters*, vol. 58, pp. 394–396, Jan. 28, 1991.

D. L. Huffaker, D. G. Deppe, and K. Kumar, "Native-Oxide Defined Ring Contact for Low Threshold Vertical-Cavity Lasers," *Applied Physics Letters*, vol. 65, pp. 97–99, Jul. 4, 1994.

M. J. Ries, T. A. Richard, S. A. Maranowski, N. Holonyak, Jr., and E. I. Chen, "Photopumped Room-Temperature Edge- and Vertical-Cavity Operation of AlGaAs-GaAs-InGaAs Quantum-Well Heterostructure Lasers Utilizing Native Oxide Mirrors," *Applied Physics Letters*, vol. 65, pp. 740–742, Aug. 8, 1994.

M. H. MacDougal, H. Zhao, P. D. Dapkus, M. Zari, and W. H. Steier, "Wide-Bandwidth Distributed Bragg Reflectors Using Oxide/GaAs Multilayers," *Electronics Letters*, vol. 30, pp. 1147–1149, Jul. 7, 1994.

K. L. Lear, R. P. Schneider, K. D. Choquette, S. P. Kilcoyne, J. J. Figiel, and J. C. Zolper, "Vertical Cavity Surface Emitting Lasers with 21% Efficiency by Metalorganic Vapor Phase Epitaxy," *IEEE Photonics Technology Letters*, vol. 6, pp. 1053–1055, Sep. 1994.

D. L. Huffaker, D. G. Deppe, and T. J. Rogers, "Transverse Mode Behavior in Native-Oxide-Defined Low Threshold 3 ertical-Cavity Lasers," *Applied Physics Letters*, vol. 65, pp. 1611–1613, Sep. 26, 1994.

D. L. Huffaker, J. Shin, H. Deng, C. C. Lin, D. G. Deppe, and B. G. Streetman, "Improved Mode Stability in Low Threshold Single Quantum Well Native-Oxide Defined Vertical-Cavity Lasers," *Applied Physics Letters*, vol. 65, pp. 2642–2644, Nov. 21, 1994.

(List continued on next page.)

*Primary Examiner*—Rodney B. Bovernick
*Assistant Examiner*—Yisun Song
*Attorney, Agent, or Firm*—John P. Hohimer; Gregory A. Cone

[57] ABSTRACT

A semiconductor light-emitting device and method. The semiconductor light-emitting device is provided with at least one control layer or control region which includes an annular oxidized portion thereof to channel an injection current into the active region, and to provide a lateral refractive index profile for index guiding the light generated within the device. A periodic composition grading of at least one of the mirror stacks in the device provides a reduced operating voltage of the device. The semiconductor light-emitting device has a high efficiency for light generation, and may be formed either as a resonant-cavity light-emitting diode (RCLED) or as a vertical-cavity surface-emitting laser (VCSEL).

46 Claims, 12 Drawing Sheets

OTHER PUBLICATIONS

D. L. Huffaker, J. Shin, and D. G. Deppe, "Low Threshold Half–Wave Vertical–Cavity Lasers," *Electronics Letters*, vol. 30, pp. 1946–1947, Nov. 10, 1994.

K. D. Choquette, R. P. Schneider, Jr., K. L. Lear, and K. M. Geib, "Low Threshold Voltage Vertical–Cavity Lasers Fabricated by Selective Oxidation," *Electronics Letters*, vol. 30, pp. 2043–2044, Nov. 24, 1994.

EFFICIENT SEMICONDUCTOR LIGHT-EMITTING DEVICE AND METHOD

This invention was made with Government support under Contract No. DE-AC04-94AL85000 awarded by the U.S. Department of Energy. The Government has certain rights in the invention.

FIELD OF THE INVENTION

The present invention relates generally to semiconductor light-emitting devices having a resonant cavity structure for the generation of light in a direction normal to the plane of an active region, and in particular to vertical-cavity surface-emitting lasers and resonant-cavity light-emitting diodes. A method for making such light-emitting devices is also described.

BACKGROUND OF THE INVENTION

Vertical-cavity surface-emitting lasers (VCSELs) and resonant-cavity light-emitting diodes (RCLEDs) are becoming increasingly important for a wide variety of applications including optical interconnection of integrated circuits, optical computing systems, optical recording and readout systems, and telecommunications. These vertically-emitting devices, with a resonant cavity perpendicular to a surface of a semiconductor wafer on which the devices are fabricated, have many advantages over edge-emitting devices, including the possibility for wafer scale fabrication and testing, and the possibility of forming two-dimensional arrays of the vertically-emitting devices. The circular nature of the light output beams from these devices also makes them ideally suited for coupling to optical fibers as in optical interconnects for integrated circuits and other applications.

VCSELs and RCLEDs have very similar device structures comprising an active region sandwiched between a pair of mirror stacks. A semiconductor p-n or p-i-n junction is formed about the active region; and an electrical injection current is provided across the junction to generate light within the active region. Electrodes above and below the mirror stacks provide an electrical connection to the devices, with one of the electrodes generally defining a central opening for the emission of light in a direction normal to the plane of the active region.

A particular problem in the development of VCSELs and RCLEDs has been the low electrical-to-optical power conversion efficiency heretofore. A low power conversion efficiency is undesirable since it reduces the light output power and produces heat (due to non-radiative recombination processes) within the device structure. Such device heating limits the maximum light output power due to a rollover of the light-vs-current characteristic curve (i.e. a decreasing light output with increasing current), and may even quench the light output completely. In the formation of two-dimensional arrays of semiconductor light-emitting devices, the heat loading from inefficient device operation increases a minimum lateral spacing of the arrayed devices, thereby reducing the manufacturing yield and increasing the array package size and cost.

To increase the power conversion efficiency of VCSELs and RCLEDs, it is necessary to minimize an electrical input power (i.e. an operating voltage and current) required to produce a specified light output power for the devices.

An advantage of the semiconductor light-emitting device and method of the present invention is that the operating voltage of the device may be reduced by periodically varying a semiconductor alloy composition within at least one mirror stack during growth to reduce the series resistance therein, and by reducing any constrictions to current flow in an upper portion of a second mirror stack.

Another advantage of the semiconductor light-emitting device and method of the present invention is that at least one high resistivity or insulating control layer may be provided near the active region to channel the current into a central portion of the active region for more efficient light generation therein.

A further advantage of the semiconductor light-emitting device and method of the present invention is that the control layer may define a lateral refractive index profile for providing a lateral confinement of the light generated in the active region.

Still another advantage of the semiconductor light-emitting device and method of the present invention is that the control layer comprises an annular oxidized portion that extends from an outer edge of the control layer laterally inward towards a central axis of the device more than any other oxidized semiconductor layers in the device, thereby providing less impediment to current flow in the portions of the device above the control layer, especially in the second mirror stack.

Yet another advantage of the semiconductor light-emitting device and method of the present invention is that an inward lateral extent of the annular oxidized portion of the control layer may be defined and increased relative to the inward lateral extent of any other oxidized semiconductor layers that may be present in the device by providing the control layer with an aluminum alloy composition higher than any aluminum composition of the other semiconductor layers.

Another advantage of the semiconductor light-emitting device and method of the present invention is that the annular oxidized portion of the control layer may have an asymmetric shape to provide a preferred direction of polarization for the light generated in the device.

Still another advantage of the semiconductor light-emitting device and method of the present invention is that a first cavity resonance may be provided in an on-axis portion of the resonant optical cavity that has a wavelength the same or different from the wavelength of a second cavity resonance in an off-axis portion of the cavity, thereby providing means for modifying or controlling optical characteristics of the device including one or more polarization states and modes of the light generated within the device.

These and other advantages of the semiconductor light-emitting device and method of the present invention will become evident to those skilled in the art.

SUMMARY OF THE INVENTION

Accordingly, it is a primary object of the present invention to provide a semiconductor light-emitting device and method which overcomes the drawbacks of the prior art.

An additional object of the present invention is to provide a semiconductor light-emitting device and method with a high electrical-to-optical power conversion efficiency.

A further object of the present invention is to reduce an operating voltage of the semiconductor light-emitting device, thereby reducing a power input to the device and improving the power conversion efficiency of the device.

Another object of the present invention is to provide a semiconductor light-emitting device and method in which the operating voltage of the device is reduced by reducing a voltage drop across at least one of the mirror stacks in the device.

Yet another object of the present invention is to provide efficient current injection into a central portion of the active region wherein the light is generated.

A further object of the present invention is to provide a semiconductor light-emitting device and method having a lateral refractive index profile to provide a lateral confinement of the light therein.

Another object of the present invention is to provide a semiconductor light-emitting device and method in which a small increase in an aluminum alloy composition provides a lateral oxidation extent in at least one control layer or control region that is larger than the lateral oxidation extent of other semiconductor layers in the device comprising the same elements but with a smaller proportion of aluminum in the alloy.

Yet a further object of the present invention is to provide a semiconductor light-emitting device and method in which an annular oxidized portion of the control layer is shaped to provide a preferred polarization state of the light generated within the device.

Additional objects, advantages, and novel features of the invention will become apparent to those skilled in the art upon examination of the following description, or may be learned by practice of the invention. The objects and advantages of the invention may be realized and attained by means of the instrumentalities and combinations particularly pointed out in the appended claims.

To achieve the foregoing and other objects, and in accordance with the purposes of the present invention as described herein, a semiconductor light-emitting device and method is provided which, according to a first embodiment of the invention, includes on a semiconductor substrate a first epitaxially-grown mirror stack having a plurality of semiconductor layers of a first doping type, a semiconductor active region epitaxially grown above the first mirror stack, a second epitaxially-grown mirror stack above the active region having a plurality of semiconductor layers of a second doping type, an epitaxially-grown control layer having an annular oxidized portion therein located adjacent to the active region within a resonant optical cavity formed by the first and second mirror stacks, and an electrode above the second mirror stack.

A second embodiment of the invention provides a pair of control layers having annular oxidized portions therein, with the control layers being located immediately above and below the active region and adjacent to the first and second mirror stacks.

In a third embodiment of the present invention, at least one control layer is provided between the semiconductor layers of at least one of the mirror stacks, the control layer having an aluminum alloy composition higher than any aluminum composition of the semiconductor layers in the mirror stack, and further having a lateral extent of oxidation larger than any lateral oxidation extent of any of the semiconductor layers epitaxially grown above the control layer.

In a fourth embodiment of the invention, a semiconductor light-emitting device and method is provided which, includes on a semiconductor substrate a first epitaxially-grown mirror stack having a plurality of semiconductor layers of a first doping type, a semiconductor active region epitaxially grown above the first mirror stack, a second epitaxially-grown mirror stack above the active region having a plurality of semiconductor layers of a second doping type and, in at least one of the mirrors, including an oxidized portion adjacent to the active region with a lateral oxidation extent exceeding any oxidation extent of any of the semiconductor layers above the oxidized portion, and an electrode above the second mirror stack.

In accordance with the present invention, embodiments of the semiconductor light-emitting device may be formed as vertical-cavity surface-emitting lasers or resonant-cavity light-emitting diodes.

Also, in accordance with the invention, the active region may include one or more quantum-well layers sandwiched between cladding layers.

Other objects, advantages and novel features of the invention will become apparent from the following detailed description thereof when considered in conjunction with the accompanying drawings.

BRIEF DESCRIPTION OF THE DRAWINGS

The accompanying drawings, which are incorporated into and form a part of the specification, illustrate several aspects of the present invention and, together with the description, serve to explain the principles of the invention. The drawings are only for the purpose of illustrating preferred embodiments of the invention, and are not to be construed as limiting the invention. In the drawings.

DETAILED DESCRIPTION OF THE INVENTION

Figure 1:
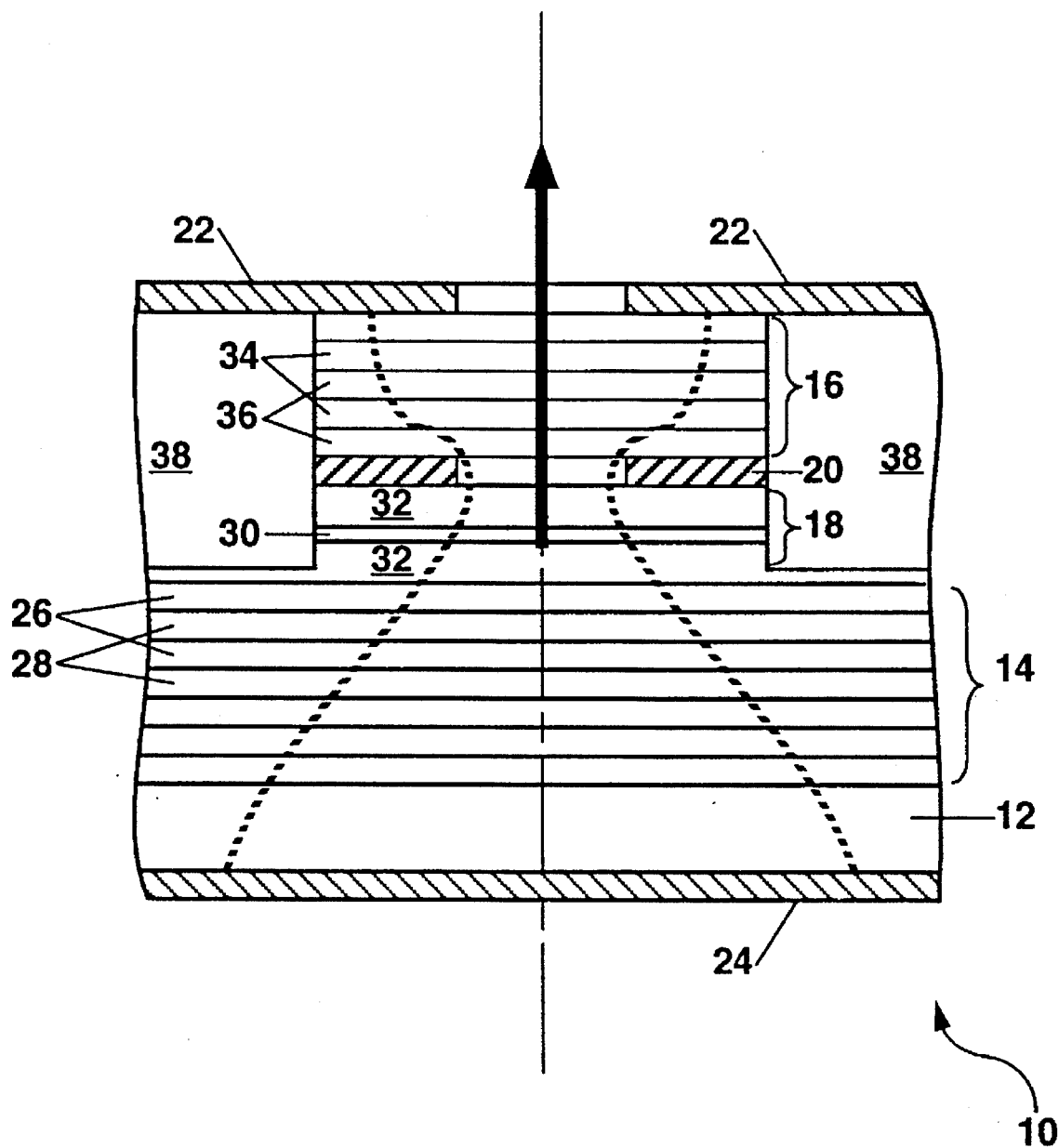
FIG. 1 shows a cross-sectional schematic illustration of a first embodiment of the present invention.

As shown in FIG. 1, the structure of the semiconductor light-emitting device 10 of the present invention is a layered structure in which light is emitted in a vertical direction that is perpendicular to the planes of the layers. In a first embodiment of the invention in FIG. 1, the semiconductor light-emitting device 10 comprises on a semiconductor substrate 12 a plurality of epitaxially-grown compound semiconductor layers forming a first mirror stack 14 above the substrate, a second mirror stack 16 above the first mirror stack, an active region 18 between the mirror stacks, and a control layer 20 between the active region and one of the mirror stacks. The semiconductor layers are etched downward at least to the control layer 20, thereby forming a mesa. The control layer 20 includes an annular oxidized portion extending inward from an outer edge that coincides with a sidewall of the mesa. An upper electrode 22 is deposited above the second mirror stack 16; and a lower electrode 24 may be deposited below the substrate 12. An insulation layer 38 may be provided to protect the etched mesa, and to provide support for the upper electrode 22.

The light-emitting device 10 according to the present invention may be formed from III-V or II-VI compound semiconductor materials with embodiments of the invention preferably being in the form of either a vertical-cavity surface-emitting laser (VCSEL) or as a resonant-cavity surface-emitting diode (RCLED). To form a VCSEL 10 according to the present invention, mirror stacks 14 and 16 are made highly reflective (preferably >99% reflectivity for the first mirror stack 14, and about 95–99% reflectivity for the second mirror stack 16) to provide a high quality factor, Q, for the resonant optical cavity formed by the mirror stacks; and the active region is designed to provide sufficient optical gain for lasing action in the cavity for an operating current range of the device. To form an RCLED device 10 according to the present invention, the second mirror stack 16 generally has a lower reflectivity of about 90% or less to provide sufficient output coupling of the light to prevent lasing action over the operating current range of the device.

The reflectivities of the first and second mirror stacks (14 and 16, respectively) may be defined during epitaxial growth of the device 10 by adjusting the number of mirror periods in each mirror stack, and/or by adjusting the semiconductor alloy compositions of a high-bandgap semiconductor layer and a low-bandgap semiconductor layer forming each mirror period. The optical gain in the device 10 may also be adjusted during the epitaxial growth process by providing either a bulk or a quantum-well active region. The number and location of quantum-wells in a quantum-well device 10 may further provide means for increasing the optical gain by maximizing a spatial overlap with an electric field antinode of the light in the resonant optical cavity.

For light emission in the visible and near-infrared regions of the spectrum, the semiconductor substrate 12 is preferably gallium arsenide (GaAs); and the substrate may be doped, for example, n-type with Si ($\geq 1\times 10^{18}$ cm$^{-3}$). A semiconductor buffer layer such as a thin layer of GaAs may initially be epitaxially grown on the substrate 12 prior to the growth of the first mirror stack 14.

The first mirror stack 14 is epitaxially grown on the substrate 12 by metal-organic chemical vapor deposition (MOCVD), molecular beam epitaxy (MBE), or the like with a first doping type that is preferably of the same polarity as the substrate 12. The first mirror stack 14 is comprised of a plurality of mirror periods forming a distributed Bragg reflector. The mirror periods are preferably formed by alternating the growth of high-bandgap and low-bandgap semiconductor layers (26 and 28, respectively) as shown in FIG. 1. The epitaxial growth of the first mirror stack 14 is generally terminated with a high-bandgap layer 26. In some instances, however, the growth may be terminated with a low-bandgap layer 28 to provide for positioning of an electric field antinode or node (i.e. maxima and minima of the electric field, respectively) of the light within the resonant optical cavity at an axial position near one or more quantum-well layers in the active region 18.

The semiconductor alloy composition, layer thickness, and number of the high-bandgap and low-bandgap semiconductor layers (26 and 28, respectively) in the first mirror stack 14 are selected to provide a high reflectivity over a wavelength range of the light generated in the semiconductor light-emitting device 10, with the wavelength range preferably being matched to a gain spectrum of the active region at an operating temperature range for the device. For embodiments of the invention providing light emission in the wavelength range of about 60) to 1000 nanometers, the high-bandgap semiconductor layers 26 are preferably aluminum arsenide (AlAs) or aluminum gallium arsenide (AlGaAs), and the low-bandgap layers 28 are preferably gallium arsenide (GaAs) or AlGaAs with a lower aluminum composition than the high-bandgap layers 26. The layer thicknesses preferably have an effective optical thickness (defined herein as the layer thickness multiplied by the refractive index, n, of the layer) that is about one-quarter of the wavelength of the light generated by the device 10. Other semiconductor alloy compositions may be used for other wavelength ranges; and the semiconductor alloy compositions may or may not include aluminum therein.

As an example, the first mirror stack 14 may be n-type doped with Si ($2\times 10^{18}$ cm$^{-3}$) and comprise 38 periods of alternating Al$_{0.96}$Ga$_{0.04}$As high-bandgap layers 26 and GaAs low-bandgap layers 28 with layer thicknesses of about 80 and 70 nanometers respectively (i.e. about one-quarter of the wavelength of the light in the layer).

In the first embodiment of the invention, a second mirror stack 16 is located above the first mirror stack with the active region 18 and control layer 20 sandwiched between the mirror stacks as shown in FIG. 1. The design of the second mirror stack 16 is similar to that of the first mirror stack except for an opposite doping type for the semiconductor layers. When the first mirror stack and substrate are n-doped, the second mirror stack is preferably p-doped (for example, with carbon to about $1\times 10^{18}$ cm$^{-3}$).

The second mirror stack 16 is comprised of a plurality of mirror periods of alternating high-bandgap and low-bandgap layers (34 and 36, respectively) forming a distributed Bragg reflector. Generally, the number of mirror periods in the second mirror stack is less than that of the first mirror stack 14 to reduce the reflectivity and allow light emission from the device 10 in the vertical direction as shown by the arrow in FIG. 1. In the previous example of a first mirror stack having 38 mirror periods, a corresponding second stack mirror may be grown with the same semiconductor alloy layer compositions and layer thicknesses, but having only about 15 to 25 mirror periods to provide for transmitting light through the second mirror stack 16. Alternately, if the direction of light emission is to be vertically downward through the substrate (which in the case of a GaAs substrate 12 is transparent at wavelengths longer than about 900 nanometers), then the number of mirror periods may be higher for the second mirror stack 16 than for the first mirror stack 14.

The first few periods of each mirror stack proximate to the active region 18 may be grown with a reduced dopant concentration as compared to the remaining periods to reduce an optical loss in the resonant cavity due to dopant impurity absorption and light scattering. In the uppermost few periods of the second mirror stack 16, the dopant concentration may be increased to about $10^{19}$ cm$^{-3}$ or more to facilitate electrically contacting the second mirror stack 16 with a deposited upper electrode 22.

A compound semiconductor active region 18 is epitaxially grown between the mirror stacks 14 and 16. The active region may include a uniform layer composition (i.e. a bulk semiconductor layer) or a gain layer surrounded by cladding layers 32 as may be preferable for the formation of a RCLED device 10; or it may include one or more quantum-well layers 30 surrounded by barrier layers with the quantum-well and barrier layers being surrounded by cladding layers 32 as may be preferable for the formation of a VCSEL device 10. (The term quantum-well layer is defined herein as a semiconductor layer providing a quantum confinement of electrons and holes therein, and also includes semiconductor layers comprising a plurality of quantum wires or quantum dots therein.)

When the active region 18 comprises one or more quantum-well layers 30 and surrounding barrier layers, the barrier layers preferably have an energy bandgap intermediate between the energy bandgaps of the quantum-well layers 30 and the cladding layers 32. (The energy bandgap of the cladding layers 32 is generally slightly less than that of the high-bandgap layers 26 and 34 in the mirror stacks.) The quantum-well layers 30 may be positioned near an antinode of the electric field of the light in the resonant optical cavity to increase the efficiency for light generation therein.

As an example, to form a VCSEL device 10 for light emission near 980 nanometers wavelength, the active region 18 may be comprised of three 8-nanometer-thick $In_{0.2}Ga_{0.8}As$ quantum-well layers 30 with each quantum-well layer being surrounded by 10-nanometer-thick GaAs barrier layers, the alternating barrier and quantum-well layers being sandwiched between $Al_{0.5}Ga_{0.8}As$ cladding layers 32. In this example, the thickness of the cladding layers 32 would be selected to provide a one-wavelength thick optical cavity for the VCSEL 10. The VCSEL according to this example may be grown by MOCVD, with the cladding layers and first and second mirror stacks being grown at a temperature of about 700° to 750° C., and the quantum-well and barrier layers being grown at a temperature of about 630° C.

As another example, an RCLED or VCSEL device 10 emitting near 630 nanometers wavelength may include an active region 18 comprised of three to six $(Al_yGa_{1-y})_{1-x}In_xP$ quantum-well layers of 2–10 nanometers thickness surrounded by $(Al_{y'}Ga_{-y'})_{1-x}In_xP$ barrier layers of 2–10 nanometers thickness, with the quantum-well and barrier layers sandwiched between $(Al_{y'}Ga_{1-y'})_{1-x}In_xP$ cladding layers of 30–1000 nanometers thickness.

In another example, an RCLED or VCSEL device 10 emitting near 1500 nanometers wavelength may include on an InP substrate an active region 18 comprised of InGaAs quantum-well layers 30 surrounded by InGaAsP barrier layers, with the quantum-well and barrier layers sandwiched between InP cladding layers 32.

For embodiments of the invention, at least one quantum-well layer 30 may be formed from a semiconductor alloy such as GaAs, AlGaAs, InGaAsP, AlGaAsP, or InAlGaAs.

The cladding layers 32 may have a semiconductor alloy composition that is uniform in the growth direction, forming a separate confinement heterostructure (SCH) active region 18. Alternately, the semiconductor alloy composition of the cladding layers 32 may be graded in the growth direction (i.e. graded from a higher-bandgap to a lower-bandgap alloy composition for the first-grown cladding layer, and graded from a lower-bandgap alloy to a higher-bandgap composition for the second-grown cladding layer), forming a graded-index separate confinement heterostructure (GRIN-SCH) active region 18.

The active region 18 has a thickness that is preferably from one to a few wavelengths of the light to be generated within the device 10, with the thickness preferably being a multiple of one-half of the wavelength of the light generated in the active region. The active region 18 may be either undoped (i.e. intrinsic, or not intentionally doped); or a portion on either side of the active region may be doped to form a semiconductor p-n or p-i-n junction within the active region 18.

In the first embodiment of the invention in FIG. 1, a control layer 20 is epitaxially grown between the active region 18 and one of the mirror stacks (14 or 16). (In a second embodiment of the invention shown in FIG. 2 and discussed hereinafter, a pair of control layers 20 are grown both above and below the active region 18.) The control layer 20 comprises a semiconductor alloy containing aluminum that may be oxidized in part after a mesa is formed, thereby increasing the resistivity in the oxidized portion of the control layer while leaving the oxidized portion transmissive to light.

The mesa may be formed by etching down at least to the control layer 20 by a wet or preferably a dry etching process such as reactive ion etching (RIE), reactive ion beam etching (RIBE), or the like. In forming the mesa, the etch depth may be measured in-situ by reflectometry to provide a precise control of the etch depth, and to allow the etch process to be stopped after etching down at least to the control layer 20. In some instances, it may be preferable to etch down beyond the control layer 20 to provide more vertical sidewalls for the mesa for uniform oxidation of one or more control layers. The etch depth may be, for example, about 5 microns.

The oxidized portion of the control layer 20 generally has an annular shape with the oxidation extending inward from one or more etched sidewalls of the mesa. The exact lateral shape of the annular oxidized portion will depend upon the shape of the mesa (for example, circular, square, rectangular, or elliptical when viewed in the direction of the light emission from the device 10) and the number of sidewalls exposed to an oxidation process. The lateral shape of the annular oxidized portion of the control layer 20 may also be influenced or controlled by additional factors which may affect the oxidation process including the semiconductor alloy composition of the control layer 20. Crystallographic preferences for oxidation may also be present, for example, due to a grading of the semiconductor alloy composition of the control layer 20 in the growth direction, or strain in the epitaxial layers. Multiple etch steps (i.e. etching different shapes to different depths) may be used to form an irregular shaped or stepped mesa to provide for different shapes of the annular oxidized portions when more than one control layer 20 is to be formed within the device 10 as in FIG. 2. Multiple annular oxidized portions, for example, above and below the active region 18 may be shaped to provide means for defining, modifying, or controlling optical characteristics including a polarization state and modes of the light in the semiconductor light-emitting device.

Figure 2:
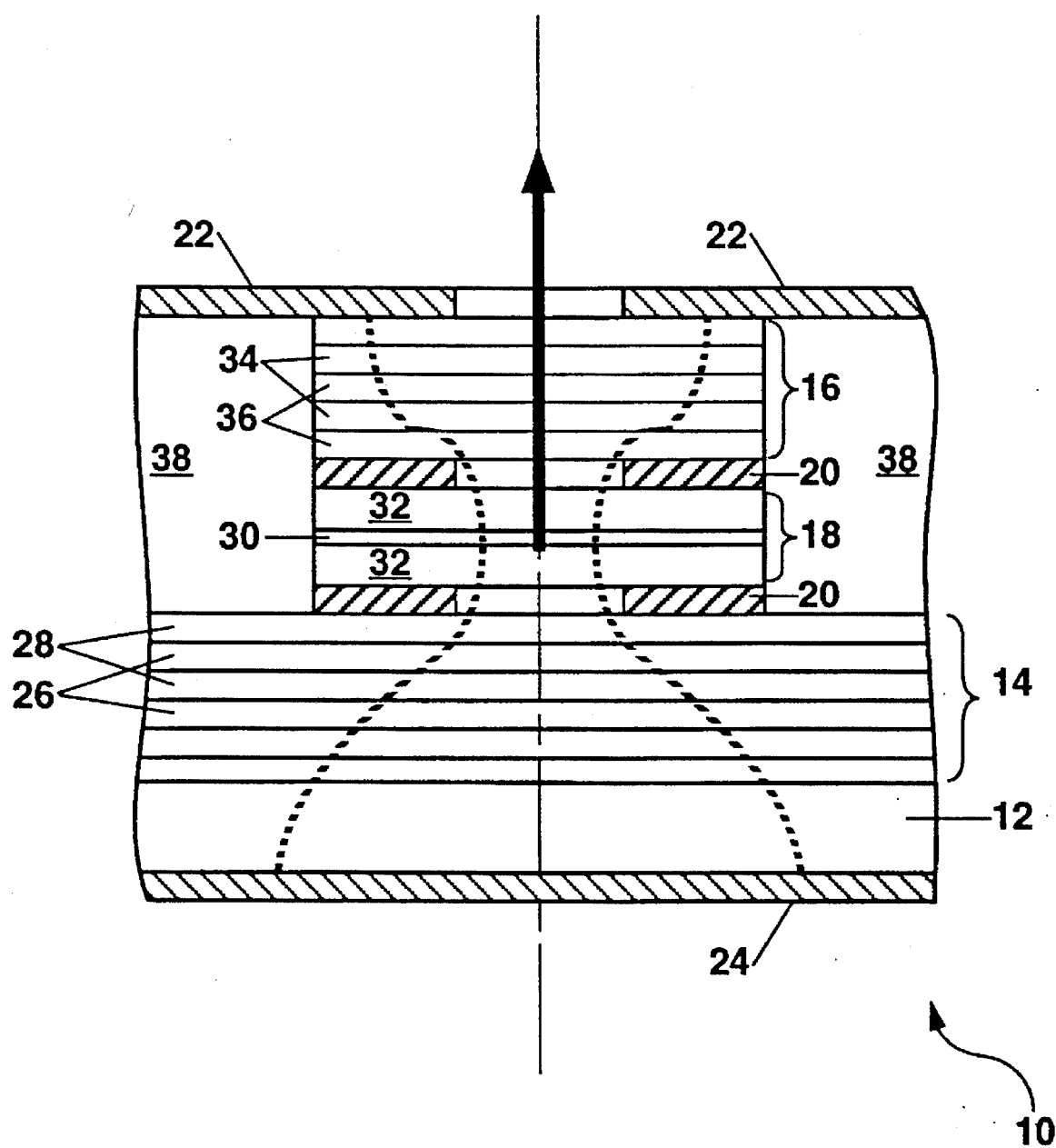
FIG. 2 shows a cross-sectional schematic illustration of a second embodiment of the present invention.
Figure 3:
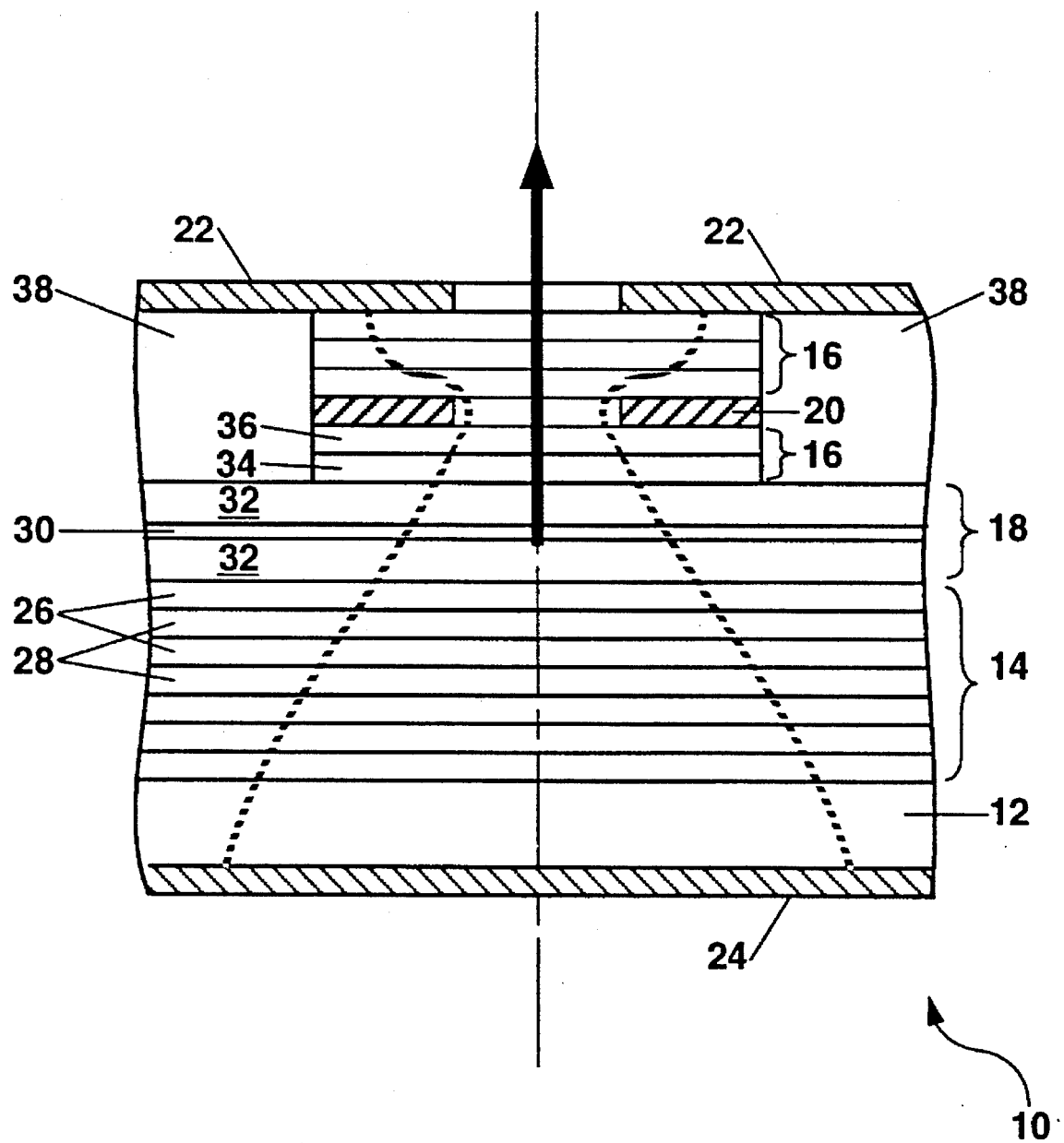
FIG. 3 shows a cross-sectional schematic illustration of a third embodiment of the present invention.

The control layer 20 in FIGS. 1–3 is characterized by a semiconductor alloy composition and layer thickness that is different from the composition and layer thickness of any of the semiconductor layers comprising the second mirror stack 16. As an example, the control layer 20 may be formed from AlAs or from AlGaAs with an aluminum composition higher than the aluminum composition of AlGaAs high-bandgap semiconductor layers in the second mirror stack 16. In this example, it is also preferable that the aluminum composition of the control layer 20 be higher than any of the layers of the active region 18 if the mesa sidewalls extend downward into the active region, exposing the active region to the oxidation process. Alternately, the control layer may contain an aluminum alloy while the second mirror stack is epitaxially grown without aluminum.

Figure 5:
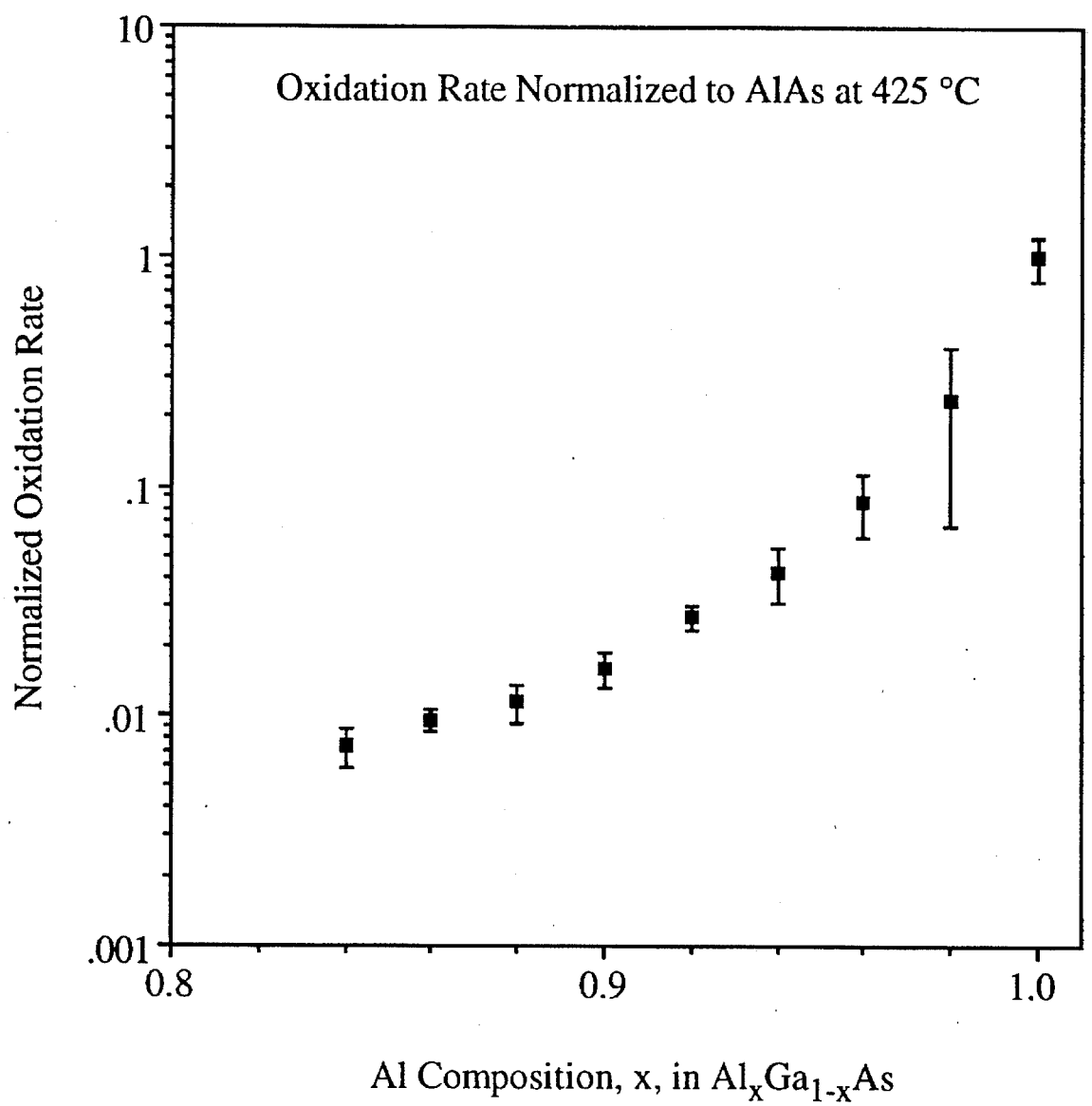
FIG. 5 shows the large variation in oxidation rate of $Al_xGa_{1-x}As$ layers for an aluminum composition, x, in the range of 0.8 to 1.0 in accordance with the present invention.

The aluminum composition of the control layer 20 may be used to selectively oxidize the control layer converting it to an oxide of aluminum. The lateral extent of oxidation of the control layer 20 according to the present invention is greater than any lateral extent of oxidation of the other semiconductor layers having exposed edges in the mesa. This selective oxidation is due to a strong compositional dependence in the lateral oxidation of $Al_xGa_{1-x}As$ layers for x in the range of about 0.8 to 1.0. (The oxidation rate of the semiconductor alloy AlGaAs may also be viewed as being suppressed by the addition of small amounts of gallium to the alloy.) The lateral oxidation rate at 425° C. for 50-nanometer-thick $Al_xGa_{1-x}As$ layers sandwiched between GaAs layers is shown in the FIG. 5 normalized to the lateral oxidation rate for layers with x=1.0 (i.e. AlAs layers). FIG. 5 presents averaged data with error bars for a number of measurements of the normalized lateral oxidation rate. FIG. 5 shows the large variation in the normalized lateral oxidation rate that may be achieved for a small change in the aluminum composition for the control layer 20 in the range indicated. According to FIG. 5, the normalized lateral oxidation rate of an AlAs control layer 20 at 425° C. may be about two orders of magnitude larger than for $Al_{0.84}Ga_{0.16}As$, and about one order of magnitude larger than for $Al_{0.96}Ga_{0.04}As$. Thus by growing all other semiconductor layers of the mesa with an aluminum composition lower than the aluminum composition of the control layer 20, the lateral oxidation extent of the other semiconductor layers may be controlled and limited to a fraction of the lateral oxidation extent of the control layer.

Preferably, the control layer 20 has an aluminum composition sufficiently high to provide about a 5:1 or higher increase in the lateral oxidation extent of the control layer 20 as compared with other aluminum-containing layers in the mesa. As an example consider a semiconductor light-emitting device having an $Al_{0.98}Ga_{0.02}As$ control layer 20 and a second stack mirror comprising alternating layers of $Al_{0.9}Ga_{0.1}As$ and GaAs. If, in this example, a 25 micron diameter mesa is etched down through the control layer 20 and the mesa layers are oxidized at about 425° C. for a time sufficient (about 60–90 minutes) to form a 10 micron lateral oxidation extent of the control layer, any oxidation of $Al_{0.9}Ga_{0.1}As$ layers of the second mirror stack 16 may be reduced by a factor of about 15 according to FIG. 5. In this way, the lateral extent of oxidation in the $Al_{0.9}Ga_{0.1}As$ layers of the second mirror stack may be limited to less than 1 micron so that the $Al_{0.9}Ga_{0.1}As$ layers do not significantly constrict or channel the flow of current within the second mirror stack 16.

The control layer 20 is preferably doped with a dopant type that is the same of the mirror stack adjacent to the control layer. Thus, when the control layer 20 is located between the active region 18 and the first mirror stack 14, the control layer is preferably doped with the dopant type of the first mirror stack 14. And when the control layer 20 is located between the active region 18 and the second mirror stack 16 as shown in FIG. 1, the control layer 20 is preferably doped with the dopant of the second mirror stack 16. The dopant concentration in the control layer 20 may be about $10^{18}$ cm$^{-3}$.

The control layer 20 functions to provide both carder (i.e. electrons and holes forming the electrical injection current) and optical confinement within the active region 20 and the resonant optical cavity. Carder confinement results from the high resistivity or insulating nature of the annular oxidized portion of the control layer 20 that directs the flow of electrical current through the central oxide-free portion of the control layer and into a central portion of the active region. By channeling the current into the central portion of the active region 18, the density of carriers is increased, improving the light generation efficiency therein. The increased optical confinement within the resonant optical cavity is due to the substantially lower refractive index, n, of the oxidized portion (n≈1.6) of the control layer 20 as compared to the central oxide-free portion (n≈2.9). The control layer 20 therefore defines a lateral refractive index profile within the resonant optical cavity; and the lateral index profile increases the lateral confinement of the light and provides for index guiding of the light within the cavity. The effect of the lateral index profile is dependent on the placement of the control layer 20 within the device 10, with the largest index-guiding effect being obtained when the control layer 20 is near the center of the resonant cavity where it interacts most strongly with the light circulating within the cavity. The index-guiding effect diminishes as the control layer 20 is moved away from the active region 18 and into one of the mirror stacks. This diminished effect is due to the decreasing intensity of the circulating light in the cavity as the light penetrates into the reflective mirror periods of the mirror stacks. Therefore, to increase the optical confinement of the light in the cavity, the control layer in the first embodiment of the invention is preferably placed between one of the mirror stacks and the active region 18. (In other embodiments of the present invention, the control layer may be located near the active region between semiconductor layers of the second mirror stack, or a control portion of at least one of the mirror stacks may have an annular oxidized portion therein extending inward to a greater lateral extent than any other oxidized portion of any of the other semiconductor layers of the mirror stack.)

The thickness of the control layer 20 may also provide a phase control of the light resonating within the optical cavity. In the central oxide-free portion of the control layer 20 the layer thickness may be selected to provide a length of the resonant optical cavity that preferably is a multiple of one-half the wavelength of the light generated in the device 10.

Although the layer thickness of the annular oxidized portion of the control layer 20 may be slightly different from the layer thickness of the central oxide-free portion (due to a change in the chemical composition of the oxidized portion), the effective optical thickness (i.e. the layer thickness multiplied by the refractive index, n) of the two portions of the control layer may be significantly different due to the large difference in the refractive index of the oxidized and oxide-free portions of the control layer 20. Thus, the control layer 20 may provide a phase shift of the light in the optical cavity passing through the annular oxidized portion of the control layer that is substantially different from the phase shift of the light passing through the central oxide-free portion of the control layer due to the difference in refractive indices of the two portions of the control layer 20. A layer thickness for the control layer 20 may be provided so that the phase shift in the annular oxidized portion may be, for example, substantially equal to a multiple of one-half of the wavelength of the light generated in the active region 18 while the phase shift in the oxide-free portion is substantially equal to a multiple of one-quarter of the wavelength of the light.

This phase shift of the light within the optical cavity may be used, for example, to discriminate against lasing in the annular oxidized portion of a VCSEL 10, or to reduce the generation of light in the annular oxidized portion of a RCLED 10. The phase shift in the annular oxidized portion of the control layer may be substantially equal to one-half of the wavelength of the light generated in the active region 18, thereby acting to reduce the reflectivity of the first and second mirror stacks and lowering the Q in an off-axis portion of the optical cavity (defined herein as an annular portion of the optical cavity formed by the mirror stacks that includes the annular oxidized portion of the control layer 20). Also, the phase shift in the annular oxidized portion of the control layer may be selected to place a node of the electric field of the light in the off-axis portion of the cavity near one or more quantum-wells in the active region 18. These phase shifts in the annular oxidized portion of the control layer 20 may act to reduce the efficiency for light generation in the off-axis portion of the cavity relative to the light generation efficiency in an on-axis portion of the cavity (defined herein as a central portion of the cavity formed by the mirror stacks that includes the oxide-free portion of the control layer 20) where an antinode of the electric field may be located near the quantum-well.

Figure 6:
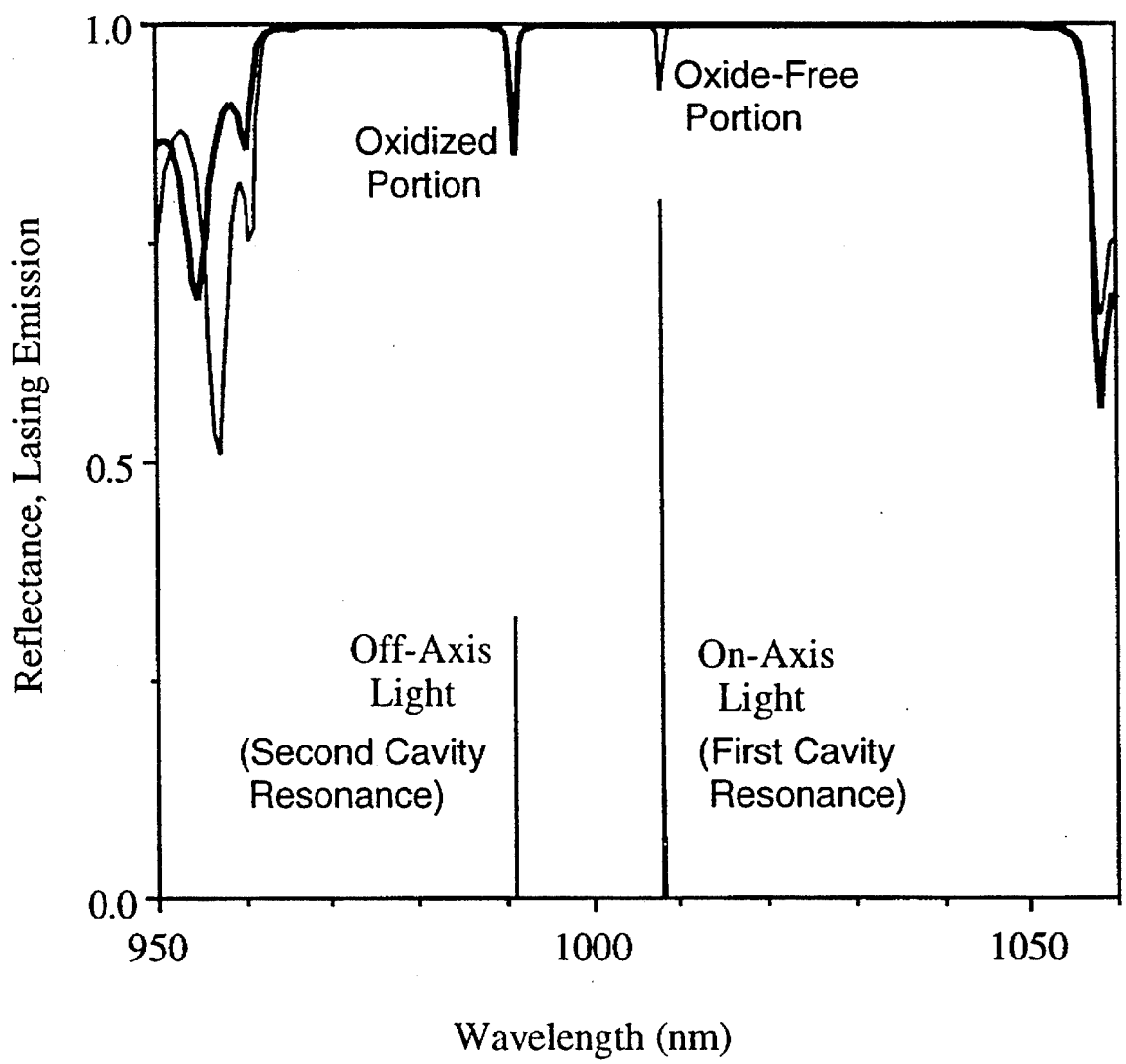
FIG. 6 shows calculated first and second cavity resonances in the reflectance of a resonant optical cavity according to the present invention, and light emission wavelengths in a VCSEL corresponding to the calculated cavity resonances.

The phase shifts in the control layer 20 may also be used to provide different resonance wavelengths of the light propagating in the on-axis portion of the cavity and in the off-axis portion of the cavity. FIG. 6 shows a measurement of a first cavity resonance (i.e. an on-axis resonance) and a second cavity resonance (i.e. an off-axis resonance) for an 83-nanometer-thick control layer 20 in a VCSEL 10, and the corresponding reflectivity of the second stack mirror 16 as measured from the top surface thereof. The calculated difference in the first and second cavity resonances in FIG. 6 is about 17 nanometers in agreement with the measured difference between the on-axis and of-axis emission; and this wavelength difference is due to the large difference in the refractive index between the oxide-free (n≈2.9) and oxidized portions (n≈1.6) of the control layer 20. In FIG. 6, the reflectivity curves show that the reflectivity of the off-axis (i.e. oxidized) portion of the resonant optical cavity (corresponding to the darker curve in FIG. 6) is actually slightly higher for wavelengths from about 960 to 1050 than that of the on-axis (i.e. oxide-free) portion of the cavity.

This relationship between the reflectivities of the on-axis and off-axis portions of the resonant optical cavity depends on the thickness of the control layer and the resultant phase shift of the light therein. Thus, the reflectivity of the off-axis portion of the cavity may be either increased or decreased relative to the on-axis cavity reflectivity by controlling the layer thickness of the control layer 20 during the epitaxial growth step. Likewise, the second cavity resonance may be either shifted down in wavelength (i.e. blue shifted) or shifted up in wavelength (i.e. red shifted) relative to the mirror reflectivity curve and a gain spectrum of the active region 18.

Figure 7:
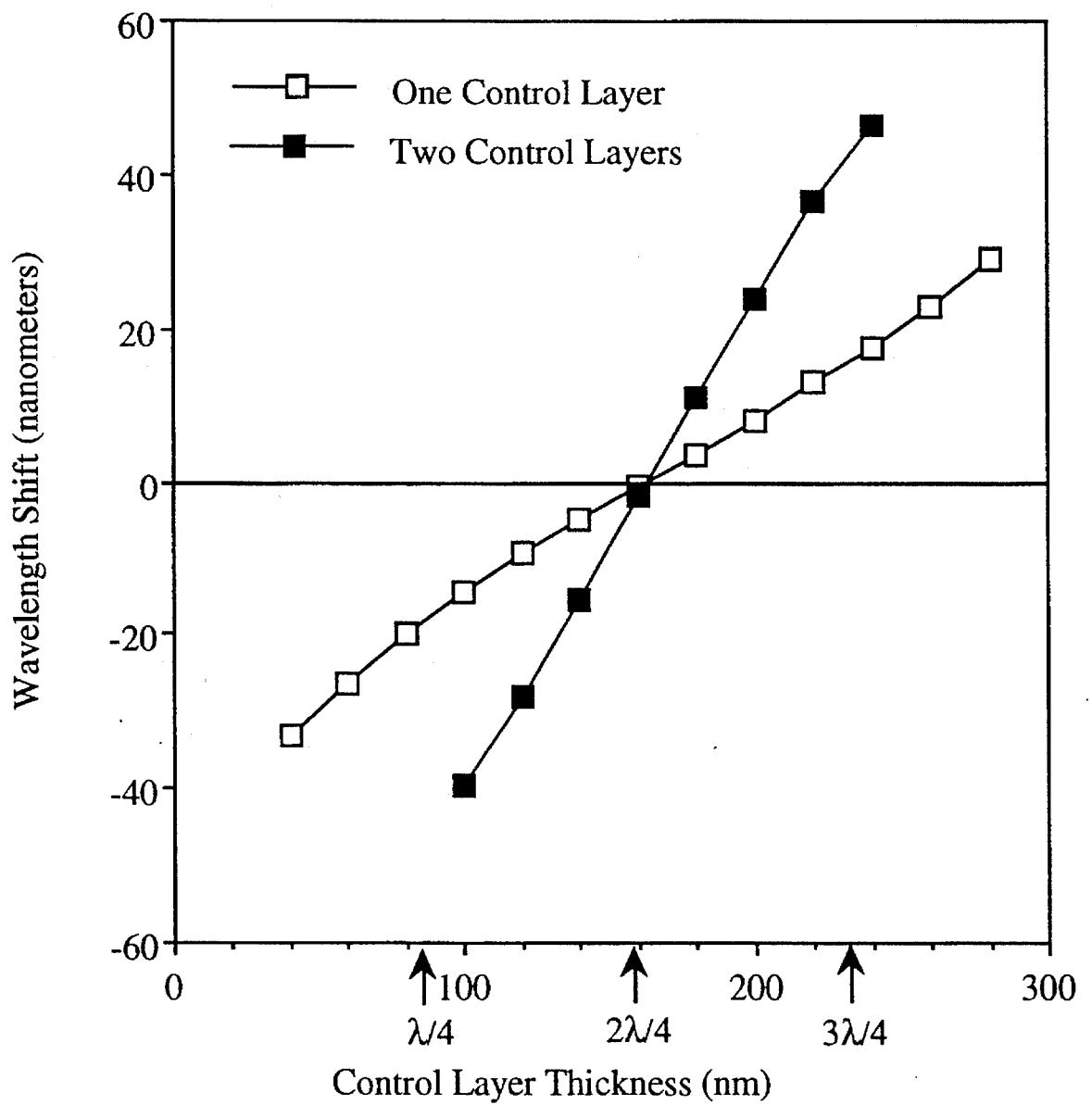
FIG. 7 shows the calculated dependence of the wavelength shift in the off-axis portion of the resonant optical cavity as a function of the thickness of the control layer for light-emitting devices having one and two control layers.

FIG. 7 shows the calculated wavelength shift between the first and second cavity resonances (in the on-axis and off-axis portions of the cavity, respectively) as the thickness of the control layer 20 is varied during growth. (Layer thicknesses corresponding to multiples of one-quarter of the wavelength, $\lambda$, of the light in the cavity are indicated by the vertical arrows in FIG. 7.) In FIG. 7, two control layers on opposite sides of the active region 18 result in about twice the shift in resonance wavelength of a single control layer on one side of the active region.

The shift in wavelength between the first and second cavity resonances has many possible applications for the semiconductor light-emitting device of the present invention. The ability to shift the wavelength of the second cavity resonance relative to the first cavity resonance and the effects resulting from such a wavelength shift (for example, increased or decreased reflectivity of the mirror stacks, and an axial shift in the antinodes and nodes of the electric field of the light in the oft-axis portion of the cavity) may provide means for defining, modifying, or controlling lateral modes in the device 10, or discriminating against light generation or lasing in the oft-axis portion of the cavity, or reducing a spontaneous emission component of the light in the off-axis portion of the cavity. For example, the second cavity resonance wavelength may be tuned to a wavelength of low gain in the active region 18 or to a wavelength of low reflectivity of the stack mirrors 14 and 16 to substantially increase a threshold current for lasing in the annular oxidized portion, or to reduce the gain for the lateral modes lasing therein. Any definition or control of the modes in the off-axis portion of the cavity will then be communicated to the on-axis portion of the cavity through the gain in the active region and by the light circulation in the cavity (i.e. by an evanescent or reflective coupling in the cavity).

The ability to define the shift in wavelength between the first and second cavity resonances during growth also may provide means for defining the polarization of the light generated within the semiconductor light-emitting device 10. For example, light may be generated in the off-axis portion of the cavity with a given polarization state, but not be emitted from the device 10 due to the opacity of the electrodes 24 and 22. The presence of this off-axis light may, however, define or control (by coupling through the gain and cavity) the polarization of the light generated in the on-axis portion of the device and emitted therefrom. (Another means for defining or controlling the polarization state of the light generated within the device 10 is by shaping the annular oxidized portion of the control layer 20 as discussed heretofore.)

The ability to control and vary the wavelength shift between the first and second cavity resonances may also be useful for frequency-mixing applications. As an example, a semiconductor light-emitting device 10 may be designed to provide light at two distinct wavelengths in the on-axis and off-axis portions of the cavity with the two wavelengths having a pre-determined and fixed frequency separation. The light output from such a device may then be directed into a high-speed photodetector for the generation of microwave or millimeter-wave electrical signals, or used for other frequency mixing applications.

The control layer 20 may also include a plurality of sub-layers of differing thicknesses and semiconductor alloy compositions on one or both sides thereof. These sub-layers, having a lower aluminum composition to reduce the oxidation rate and extent therein, may provide an offset in a valence or conduction energy band (for example, a minority carrier band offset in a high-bandgap sub-layer) sufficient to prevent or reduce the migration of carders (for example, minority carriers) to surfaces of the annular oxidized portion, and thereby prevent or reduce a rate of nonradiative carrier recombination at these surfaces. In addition, the sub-layers may act to reduce strain effects in the active region due to a slight change in thickness of the annular oxidized portion of the control layer 20 resulting from the chemical change therein due to the formation of an oxide of aluminum. These sub-layers may be, for example, quantum-well layers of AlAs, AlGaAs, GaAs, or the like with thicknesses of about 10 nanometers or more. Alternately, the semiconductor alloy composition of the control layer 20 may be smoothly or periodically varied in the growth direction to provide a control layer in which the lateral oxidation extent is variable across the thickness of the layer.

To electrically contact the semiconductor light-emitting device 10, upper and lower electrodes are preferably deposited above the second mirror stack 16 and below the substrate 12, respectively. The upper and lower electrodes (22 and 24, respectively) may be formed from an opaque metallization (i.e. optically thick), a semi-transparent metallization (for example, indium-tin-oxide), or a metallization patterned to define a central opening for transmission of the light therethrough. The particular type of metallization for each electrode will depend upon whether the light is emitted upward (as in FIG. 1) or downward (i.e. through the substrate 12), with the semi-transparent or patterned metallization preferably being used for coupling light out of the device 10. The upper electrode 22 may be deposited before or alter formation of the mesa. If the upper electrode 22 is deposited before the formation of the mesa by an etching step, the upper electrode may either be protected by an overlying layer deposited and patterned for use as an etch mask; or the upper electrode may form at least a pan of the etch mask.

In the first embodiment of the invention shown in FIG. 1, the upper electrode 22 may be formed, for example, by depositing a AuBe/Ti/Au metallization above a p-type second mirror stack 16, and defining the central opening therein by a lithographic masking and lift-off process. Likewise, in FIG. 1, the lower electrode 24 may be formed, for example, by depositing a AuGe/Ni/Au patterned or full-surface metallization on the lower surface of an n-type substrate 12. (If the doping types of the substrate and second stack mirror are reversed in the above example, the above compositions of the electrode metallizations would also be reversed.) After deposition, the metallizations are annealed, forming electrical contacts to the semiconductor light-emitting device 10.

The central opening in a patterned upper electrode 22 is generally sized to be at least as large in diameter as the oxide-free portion of the control layer 20, but smaller in diameter than the top surface of the mesa. In this way, light may be efficiently coupled out from the light-emitting device 10 through the central opening while allowing the electrical current to be efficiently coupled into the second stack mirror 16, and therefrom to the active region 18.

By placing the control layer adjacent to the active region in the first embodiment of the invention in FIG. 1, the electrical current (as shown schematically by the dashed lines in FIGS. 1 to 4) may flow more freely through the device 10 than would be possible if the entire second mirror stack were constricted (for example, by oxidized portions of each mirror period, or by ion implantation throughout) for current channeling. According to the first embodiment of the present invention, a channeling of the electrical current in the device 10 is accomplished by locating at least one control layer 20 adjacent to a surface of the active layer 18, while the mirror periods of the second mirror stack 16 are substantially non-constrictive to current flow, thereby reducing a series resistance of the second mirror stack and increasing the electrical-to-optical power conversion efficiency of the light-emitting device 10.

To further increase the power conversion efficiency of the semiconductor light-emitting device 10, the operating voltage across the device is preferably made as low as reasonably possible for a device 10 of a given size, so that a voltage drop across the device is largely confined to the vicinity of the active region 18. Thus, any voltage drops across the n- and p-type mirror stacks are preferably minimized.

In the present invention, minimizing the voltage drops across the mirror stacks is preferably achieved by epitaxially growing one or both of the mirror stacks with a smooth periodic continuous alloy composition grading in the mirror stacks to eliminate or reduce any heterojunction potential energy barriers that may otherwise be present between the high-bandgap and low-bandgap semiconductor layers in each mirror period of the stack. Such continuous alloy composition grading is preferably used for reducing the voltage drop across at least the p-type mirror stack.

The use of carbon as a p-type dopant, for example, may also be advantageous for the continuous alloy composition grading of the p-type mirror stack due to the low diffusivity and high solubility of carbon in GaAs and AlGaAs. As an example of such periodically varying compositional grading, a smooth continuous change in composition from a low-bandgap GaAs semiconductor layer to a high-bandgap $Al_{0.90}Ga_{0.10}As$ semiconductor layer in each period of the p-type mirror stack may be made over a distance of about 28 nanometers when growing the semiconductor light-emitting device 10 by MOCVD.

The use of smooth continuous alloy composition grading is advantageous in that it permits the semiconductor light-emitting device 10 of the present invention to have a low operating voltage while being epitaxially grown in a single growth process, rather than forming the second stack mirror by a later deposition process after first depositing and patterning the upper electrode.

Alter growth of the semiconductor layers of the light-emitting device 10, the mesa is formed by lithographically patterning the top surface of the second mirror stack 16 and depositing thereon a suitable material (for example, silicon nitride, silicon oxide, silicon oxynitride, metal silicides, or refractory metals) as an etch mask. After etching the mesa structure down to or through the control layer 20, the etch mask may be left in place to protect the top layer of the second minor stack, or removed prior to the oxidation process.

Immediately prior to the oxidation process, the semiconductor wafer containing a plurality of devices 10 may be wet etched slightly (for example a 10 second etch in a 1:1:10 solution of $H_3PO_4:H_2O_2:H_2O$) to remove surface contamination, ion etch damage, dry air oxides and the like that may affect the oxidation process; and then the wafer may be dried with a stream of air or nitrogen gas. The oxidation process is carried out by placing the wafer into a container and heating the wafer to a temperature of about 350° to 500° C. (and preferably between about 400° and 450° C.) under a controlled environment having a high humidity. Such a moist environment may be generated, for example, by flowing a gas, such as nitrogen, through water heated to about 80°–95° C. to entrain water vapor, and then directing the moisture-laden gas into the container.

The time required for formation of the annular oxidized portion of the control layer 20 is variable, depending on the temperature to which the semiconductor wafer is heated, the thickness of the control layer 20, and the lateral extent to which the control layer is to be oxidized (i.e. the lateral dimension of the annular oxidized portion). As an example, at a temperature of 450° C. and a 83-nanometer-thickness of the control layer, about 30 to 40 minutes may be required to oxidize the control layer to a lateral distance of about 50 microns. At a temperature of 425° C. the same control layer 20 may be oxidized to the same lateral distance in about 330 minutes. In general, the time required for oxidizing a 50-nanometer-thick control layer 20 may be from about 30 to 150 minutes or more for an oxidation temperature in the range of about 400° to 450° C. The composition and quality of the aluminum oxide formed by the oxidation process may also be temperature dependent.

After the oxidation process is completed, an insulation layer 38 may be deposited or spun onto the semiconductor wafer to protect and passivate the etched mesa and exposed semiconductor layers, and to planarize the light-emitting devices 10 formed on the semiconductor wafer. The insulation layer may be formed of any insulating material as is commonly used in the art including polyimides, spin-on-glasses, silicon dioxide, silicon nitride, and the like.

The upper and lower electrodes (22 and 24, respectively) may be deposited and annealed to form electrical contacts to the semiconductor light-emitting device 10. In some embodiments of the invention, the etching process used to form the mesa-structure may penetrate down to or into the first stack mirror 14 as shown in FIG. 2. In this case, a lithographic mask may be used to deposit and pattern the lower electrode 24 directly upon an exposed etched surface of one of the semiconductor layers of the first stack mirror 14 (preferably a GaAs layer having a doping concentration of about $10^{19}$ cm$^{-3}$). This top-side contacting process may be advantageous for the formation of high-speed semiconductor light-emitting devices on a semi-insulating substrate 12. (The presence of the annular oxidized portion of the control layer 20 with a reduced dielectric constant may also improve high-speed performance of the semiconductor light-emitting device 10 by reducing the capacitance therein.)

The semiconductor light-emitting device 10 may be mounted on a heat sink with the substrate positioned in contact with the heat sink and attached thereto. An operating voltage applied across the upper and lower electrodes produces a current flow in the device 10 which generates light or lasing action therein.

A second embodiment of the invention is shown in FIG. 2. In this embodiment of the invention, a pair of control layers 20 are provided with a first control layer grown below the active region 18 and a second control layer grown above the active region 18. In this second embodiment of the invention, the mesa is etched down at least to the first-grown control layer 20 as shown in FIG. 2, thereby exposing both of the control layers to the oxidation process for formation of the annular oxidized portions therein. The lateral oxidation extent of the two control layers may be the same or different, and may be controlled by means of the aluminum composition of the control layers. (Each control layer is doped with the polarity of the adjacent mirror stack.) A stepped mesa may provided for a different lateral oxidation extent of each of the control layers 20, thereby providing means for defining, modifying, or controlling the polarization state and modes of the light generated within the device 10.

The additional control layer in the second embodiment of the invention in FIG. 2 allows the electrical current to be constricted and channeled on both sides of the active region 18. This additional constriction more tightly confines the electrical current in the active region, reducing a lateral spread of the carders (i.e. electrons and holes forming the current), and increasing the carder density for a more efficient generation of light therein. The additional control layer 20 in FIG. 2 also contributes to the lateral refractive index profile leading to an increased lateral confinement (i.e. increased index guiding) of the light within the resonant optical cavity. Additionally, this second embodiment of the invention may be advantageous in providing a lateral refractive index profile that is more uniformly distributed along the length of the optical cavity than would be the case for only a single control layer 20 located on one side of the active region 18.

This second embodiment of the invention may be in the form of a VCSEL with high reflectivity mirror stacks, or as a RCLED with a reduced reflectivity second mirror stack 16.

A third embodiment of the present invention is shown schematically in FIG. 3. In this embodiment, at least one control layer 20 is located between the semiconductor layers of one or both of the mirror stacks (14 and 16). The control layer 20 is preferably located near the active region 18 for effective current channeling. Placing the control layer between semiconductor layers of one or both of the mirror stacks may be advantageous in reducing the rate of nonradiative carrier recombination at interfaces of the annular oxidized portion with adjacent semiconductor layers. Locating the control layer between layers of the mirror stacks also provides a further degree of control over the magnitude of the lateral refractive index profile produced by the control layer. This is due to the intensity of the light being reduced by the reflectivity of the intervening mirror periods before interacting with the control layer, and thereby reducing the effect of the lateral refractive index profile when that light is reflected back into the resonant optical cavity.

The control layer 20 in the third embodiment of the invention is characterized by an aluminum alloy composition higher than that of any of the semiconductor layers comprising the second mirror stack 16. (The second mirror stack 16 may also be formed of semiconductor alloys having no aluminum content therein.) The control layer 20 may also be characterized by a layer thickness that is different from that of any layers of the second stack mirror. For example, in a second mirror stack 16 comprising AlGaAs high-bandgap layers 34 and GaAs low-bandgap layers 36, the control layer 20 may comprise AlAs layers.

When the control layer 20 is placed between semiconductor layers of the second mirror stack 16 as in this third embodiment of the invention, the thickness of the control layer 20 is preferably selected so that the light traversing the oxide-free portion of the control layer has a proper phase relationship so that the reflectivity of the overlying layers of the second mirror stack is not substantially reduced.

The third embodiment of the invention may be in the form of a VCSEL or as a RCLED by reducing the number of mirror periods in the second mirror stack 16 during growth.

Figure 4:
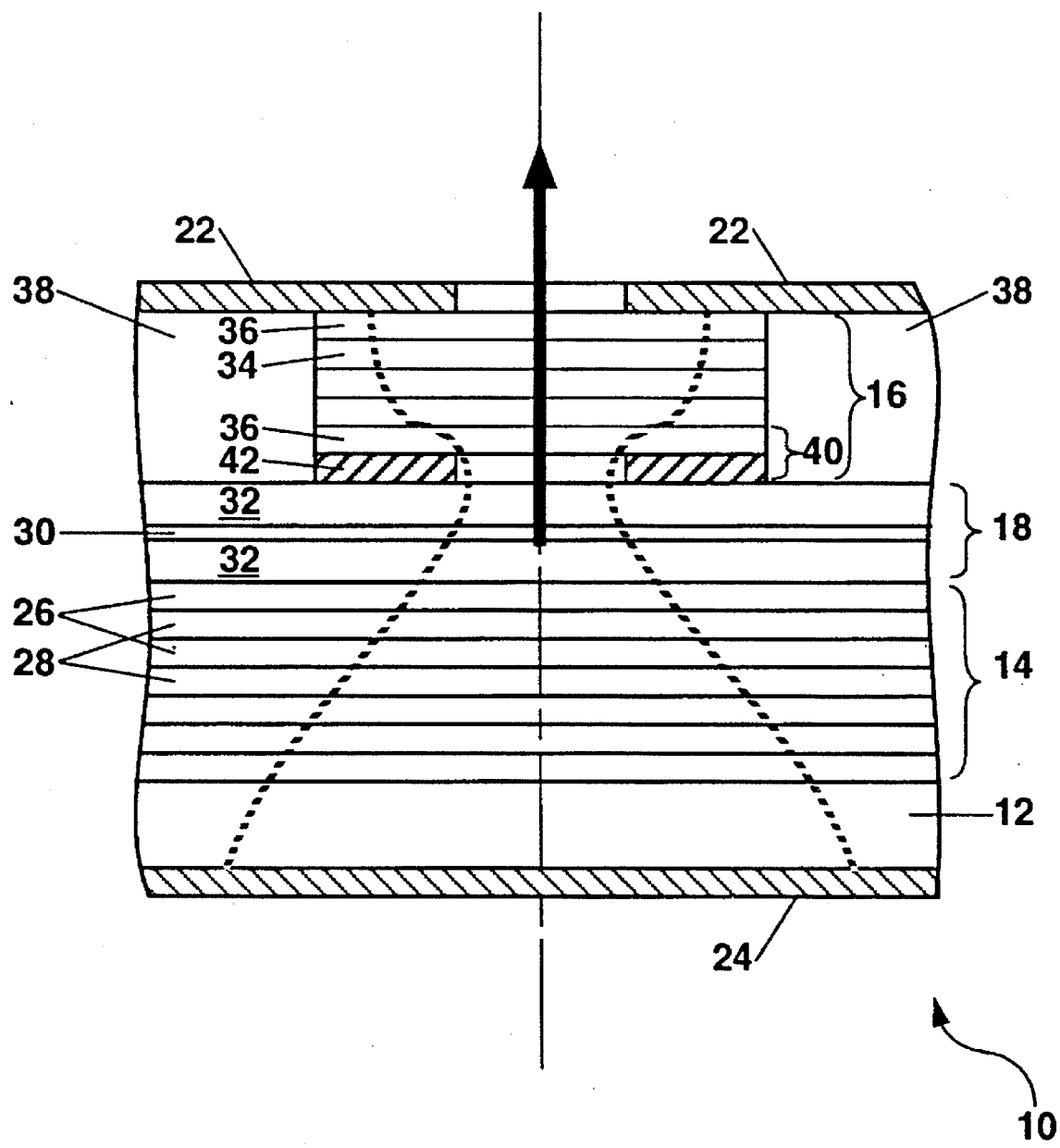
FIG. 4 shows a cross-sectional schematic illustration of a fourth embodiment of the present invention.

A fourth embodiment of the present invention is shown schematically in FIG. 4. In this embodiment, one or both mirror stacks (14 and 16) includes a control portion 40 adjacent to the active region 18, with the control portion 40 having at least one oxidized layer 42 therein with an annular oxidized portion thereof. The oxidized layer 42 is characterized by an aluminum alloy composition higher than that of a plurality of semiconductor layers in the second mirror stack 16 epitaxially grown above the control portion 40 (or semiconductor layers in the first mirror stack 14 grown below the control portion). The oxidized layer 42 may further have a layer thickness that is different from that of the plurality of semiconductor layers in the second mirror stack 16 above the control portion 40. The control portion 42 may have a slightly lower doping level (about $10^{18}$ cm$^{-3}$) than the other semiconductor layers of the mirror stack due to the placement of the control portion near the active region 18.

In this embodiment of the invention, the higher aluminum composition of the oxidized layer 42 provides a greater lateral extent of oxidation for the annular oxidized portion therein than the layers in the second mirror stack 16 above the control portion 40. In this way, the electrical current may be effectively channeled into the central portion of the active region 18 while providing a low resistance for an upper portion (preferably comprising a majority of the mirror periods) of the second stack mirror 16.

Preferably, the oxidized layer 42 has an aluminum composition sufficiently high to provide about a 5:1 or higher increase in the lateral oxidation extent of the oxidized layer 42 as compared with other semiconductor layers in the second stack mirror 16. As an example consider a semiconductor light-emitting device 10 having an $Al_{0.98}Ga_{0.02}As$ oxidized layer 42 in the control portion 40 of the second mirror stack 16, with the remaining semiconductor layers of the second stack mirror comprising $Al_{0.9}Ga_{0.1}As$. With these semiconductor alloy compositions, the lateral extent of oxidation in the oxidized layer 42 may be about 15 times larger than that of the overlying $Al_{0.9}Ga_{0.1}As$ layers according to FIG. 5. Thus, the control over the lateral oxidation extent provided by increasing the aluminum composition in the oxidized layer 42 is a significant advance compared to uniformly oxidizing all the semiconductor layers in the second mirror stack 16 having an aluminum composition therein. As a result, the oxidized layer 42 may form a current channel into the active region 18, and provide a lateral refractive index profile within the resonant optical cavity while the overlying $Al_{0.9}Ga_{0.1}As$ layers of the second mirror stack are not significantly oxidized, and therefore do not significantly constrict or channel the flow of current within the second mirror stack 16.

Another advantage of the present invention is that the conductivity of the mirror stack having the control portion 40 is substantially improved since only the control portion substantially constricts and channels the current flow, allowing the current to move freely in the lateral and vertical directions in the overlying layers of the mirror stack. By forming the oxidized layer 42 of AlAs in the above example, the lateral oxidation extent may be further increased to about 60 times that of the overlying $Al_{0.9}Ga_{0.1}As$ layers of the second mirror stack 16. Thus for a 25-µm-diameter mesa, the lateral oxidation extent of the overlying $Al_{0.9}Ga_{0.1}As$ layers of the second mirror stack may be much less than a micron.

The control portion 40 in this fourth embodiment of the invention functions nearly identically to the control layer 20 in the first, second, and third embodiments of the invention. Therefore the discussion heretofore relating to the control layer 20 may also be applied to the control portion 40 and in particular to the oxidized layer 42. The control portion 40 may be shaped by etching to provide a shaped oxidized layer 42, thereby providing means for defining a polarization state or lateral mode or both in the device 10 in a manner as described heretofore. The control portion also defines a lateral refractive index for confining and index-guiding the light in a manner as described heretofore.

This fourth embodiment of the invention may also be in the form of a VCSEL or as a RCLED in a manner similar to the embodiments of the invention described heretofore.

According to the present invention, a third mirror stack may be provided above the second mirror stack 16 (and the upper electrode 22). This third mirror stack comprises alternating layers of high-index and low-index dielectric materials (for example, amorphous or polycrystalline materials) formed by a deposition process. The third mirror stack may be added to the semiconductor light-emitting device 10 improve the efficiency of light generation therein, or to alter the fraction of light coupled out from the device.

Figure 8:
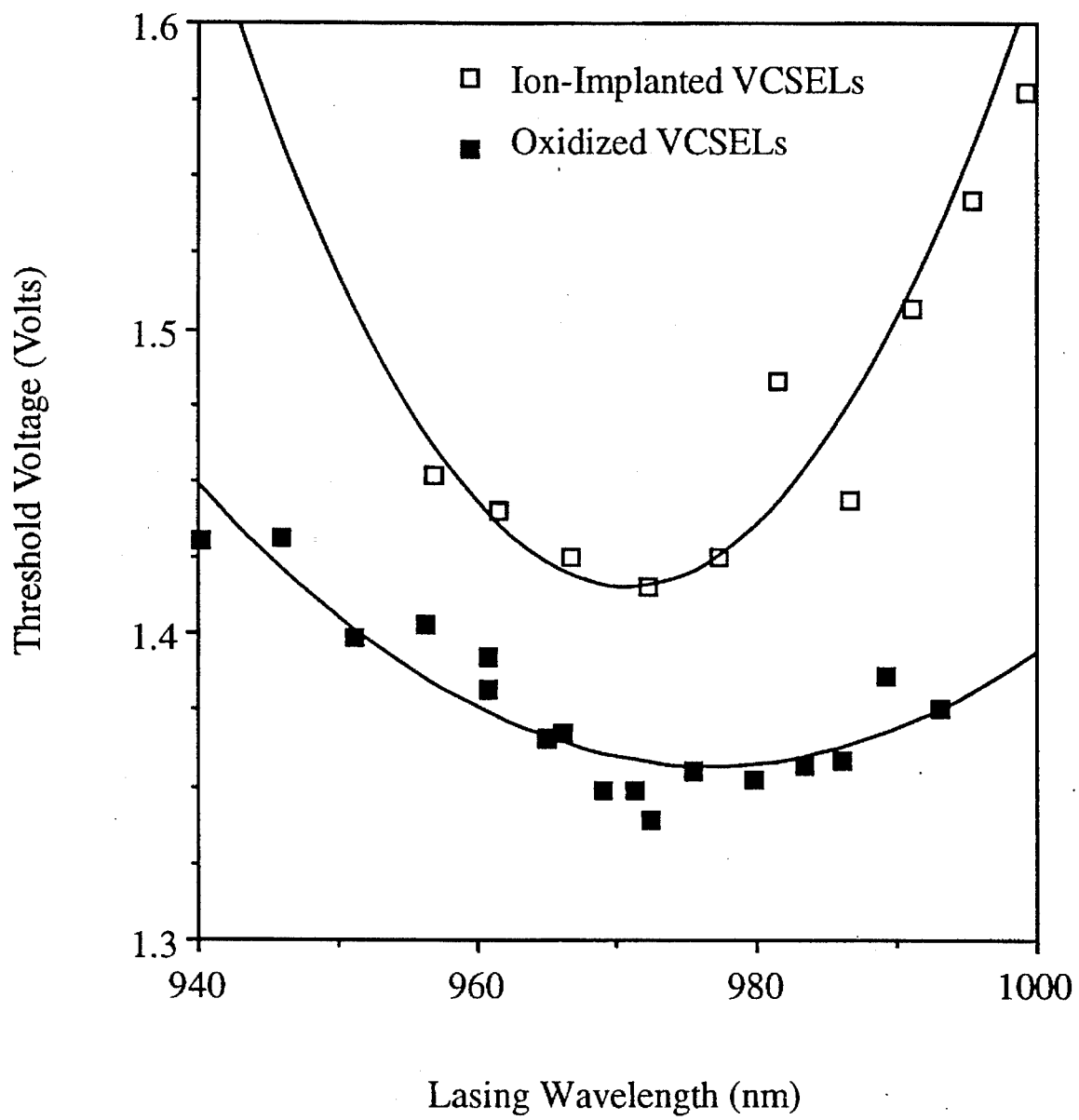
FIG. 8 shows the reduced voltage at the lasing threshold for oxidized VCSELs fabricated according to the present invention as compared with ion-implanted VCSELs fabricated from the same wafer.
Figure 9:
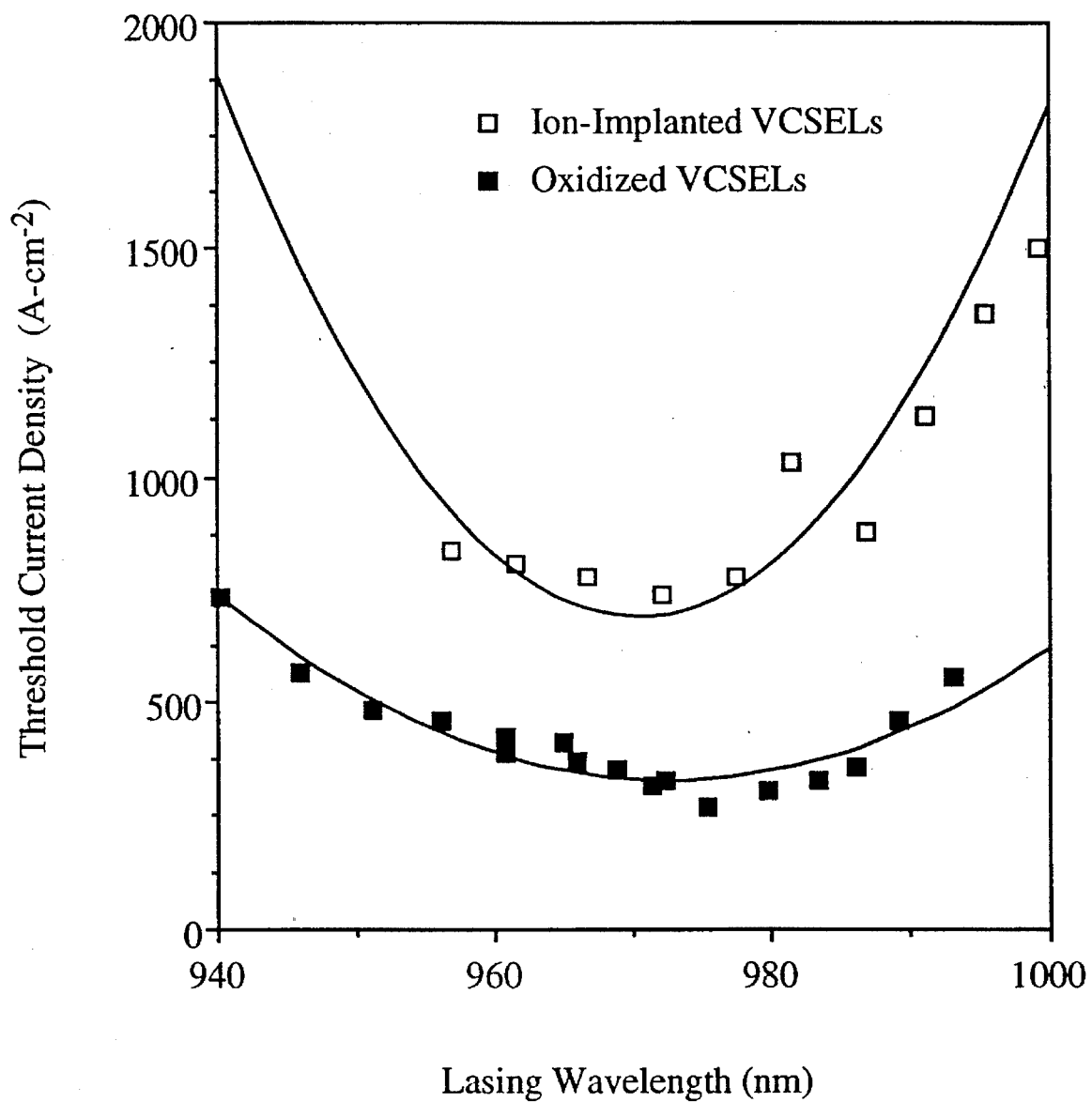
FIG. 9 shows the threshold current densities for the VCSELs of FIG. 8, and the improvement in threshold current density that may be achieved according to the present invention.

FIGS. 8 and 9 show the improvement in VCSELs fabricated according to the present invention as compared with VCSELs formed from the same epitaxially-grown semiconductor wafer (having an InGaAs three-quantum-well active region) by an ion-implantation process. Although the semiconductor light-emitting devices discussed hereinafter take the form of VCSELs, RCLEDs may also be fabricated with similar operating characteristics with a slight modification to the growth step (i.e. reducing the number of mirror periods in the second mirror stack 16). Although RCLED embodiments may have a reduced light output power and power conversion efficiency, the operating voltage and current characteristics are expected to be similar to those presented below.

In FIG. 8, the threshold voltages (i.e. the operating voltage between the upper and lower electrodes of each device at the threshold for lasing action) and curve fits thereof are compared for a number of VCSELs (with light-emitting areas of about 400 to 1000 µm$^2$) fabricated with a single control layer 20 by the oxidation process of the present invention, and also for VCSELs (with light-emitting areas of about 700 µm$^2$) fabricated by a high-energy ion-implantation process (which provides an electrical-to-optical power conversion efficiency of up to 21%).

In FIG. 8, the threshold voltages are plotted against the wavelength of the emitted light at the lasing threshold to show the wavelength dependence of the threshold voltage due to the mirror reflectivity curves and the gain spectrum in the active region. The emission wavelength, centered near 970 nanometers, corresponds to a photon energy of about 1.28 electron volts. Thus, the oxidized VCSELs 10 according to the present invention provide a minimum fitted threshold voltage of about 1.36 volts, or only about 0.08 volts above an ideal voltage drop across the active region (i.e. the voltage drop across the active region in the ideal case being equal to the energy of the emitted photons). This low threshold voltage is due to the low series resistance (both laterally and vertically) in the first and second mirror stacks, and also due to very efficient current injection into the active region as shown by the correspondingly low threshold current densities in FIG. 9. This reduction in the threshold voltage for the oxidized VCSELs 10 is a significant improvement over the ion-implanted VCSELs which show a minimum fitted threshold voltage of about 1.42 volts, or 0.14 volts above the ideal voltage drop across the active region. FIG. 8 also shows that the threshold voltage of the oxidized VCSELs according to the present invention varies much less with the emission wavelength than for the ion-implanted VCSELs. This reduced variability of the threshold voltage is advantageous in making the light-emitting devices 10 of the present invention less dependent on processing parameters that may alter or affect the wavelength of the emitted light (for example, variations in semiconductor layer thicknesses and compositions across a semiconductor wafer during growth).

FIG. 9 shows threshold current density (i.e. the current at the threshold for lasing divided by an area of light generation in the active region) versus the light emission wavelength at threshold for the oxidized VCSELs and ion-implanted VCSELs of FIG. 8. The minimum fitted threshold current density (about 350 A/cm$^2$) for the oxidized VCSEL devices 10 of the present invention is about one-half that for the ion-implanted VCSELs fabricated from the same epitaxial wafer. This further shows the improvement in device characteristics realized according to the present invention. The variability in the threshold current density with wavelength is also much smaller for the oxidized VCSELs 10, again making the oxidized VCSELs of the present invention less dependent on layer thickness variations during growth, and enhancing their manufacturability.

Since the same epitaxial wafer was used for both the oxidized VCSELs 10 and the ion-implanted VCSELs, the higher threshold voltages and currents for the ion-implanted VCSELs are most likely due to the high-energy ion implantation process that is used to compensate the material around the resonant optical cavity and to provide current flow into the active region. These high-energy ions must penetrate downward through the semiconductor layers of the second stack mirror damaging the layers and increasing the resistance therein. The ion-implanted region must be sufficiently removed from the central light-generating portion of the active region to reduce ion-induced damage therein; and this results in a lateral spreading of the current in the active region.

The oxidized VCSEL 10 of the present invention is advantageous in that the control layer 20 may be placed in direct contact with the active region 18 to substantially reduce the current spreading. The ion-implanted VCSELs are also limited in size to $\geq 5$ microns due to the lateral extent or straggle of the implanted ions which must be sufficiently removed from the central portion of the active region. Thus, although, oxidized VCSELs may be fabricated with a 2 μm×2 μm light-generating area in the active region as in FIG. 12, it would not be possible to fabricate ion-implanted VCSELs nearly this small. Other advantages of the oxidized VCSEL 10 of the present invention over ion-implanted VCSELs are that the size of the central opening for the emission of light through one of the electrodes does not affect the threshold current for the oxidized VCSELs 10 (unless the opening is smaller than the central light-generating region in the active region). And, the oxidized VCSELs show more stable operating characteristics (current, voltage, and light output power) than do the ion-implanted VCSELs which generally exhibit a burn-in effect, with the light output power at a fixed current changing over time.

Figure 10:
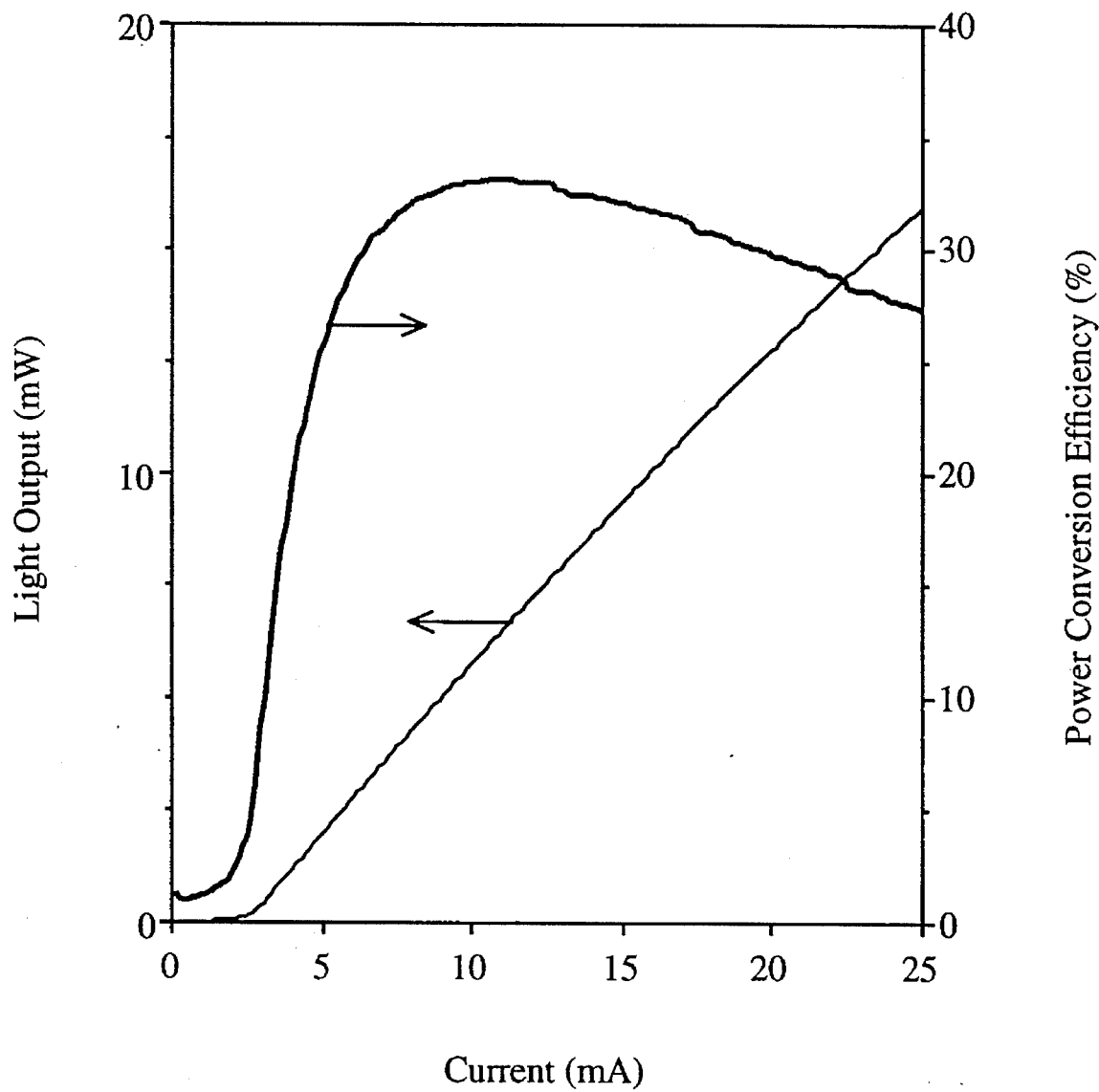
FIG. 10 shows the dependence of the continuous-wave (cw) light output power and the electrical-to-optical power conversion efficiency on the injection current for a first VCSEL according to the invention, with a maximum power conversion efficiency of about 33%.

By simultaneously reducing both the threshold voltage and current density in the semiconductor light-emitting devices 10 of the present invention, a significant advance in the electrical-to-optical power conversion efficiency may be realized as compared with the ion-implanted VCSELs. This is shown in FIG. 10 which presents characteristic curves showing the dependence of the continuous-wave (cw) light output power and the power conversion efficiency on the injection current for a first VCSEL 10 according to the invention. This first VCSEL with a rectangular light emitting area of 317 gm$^2$ has threshold current of about 2 mA, and a power conversion efficiency of about 33% near 10 mA current, a 50% improvement in efficiency as compared with ion-implanted VCSELs. The lasing output power from this device is linear with increasing current, with an output power up to about 16 mW, and a power conversion efficiency of about 27% at 25 mA current.

Figure 11:
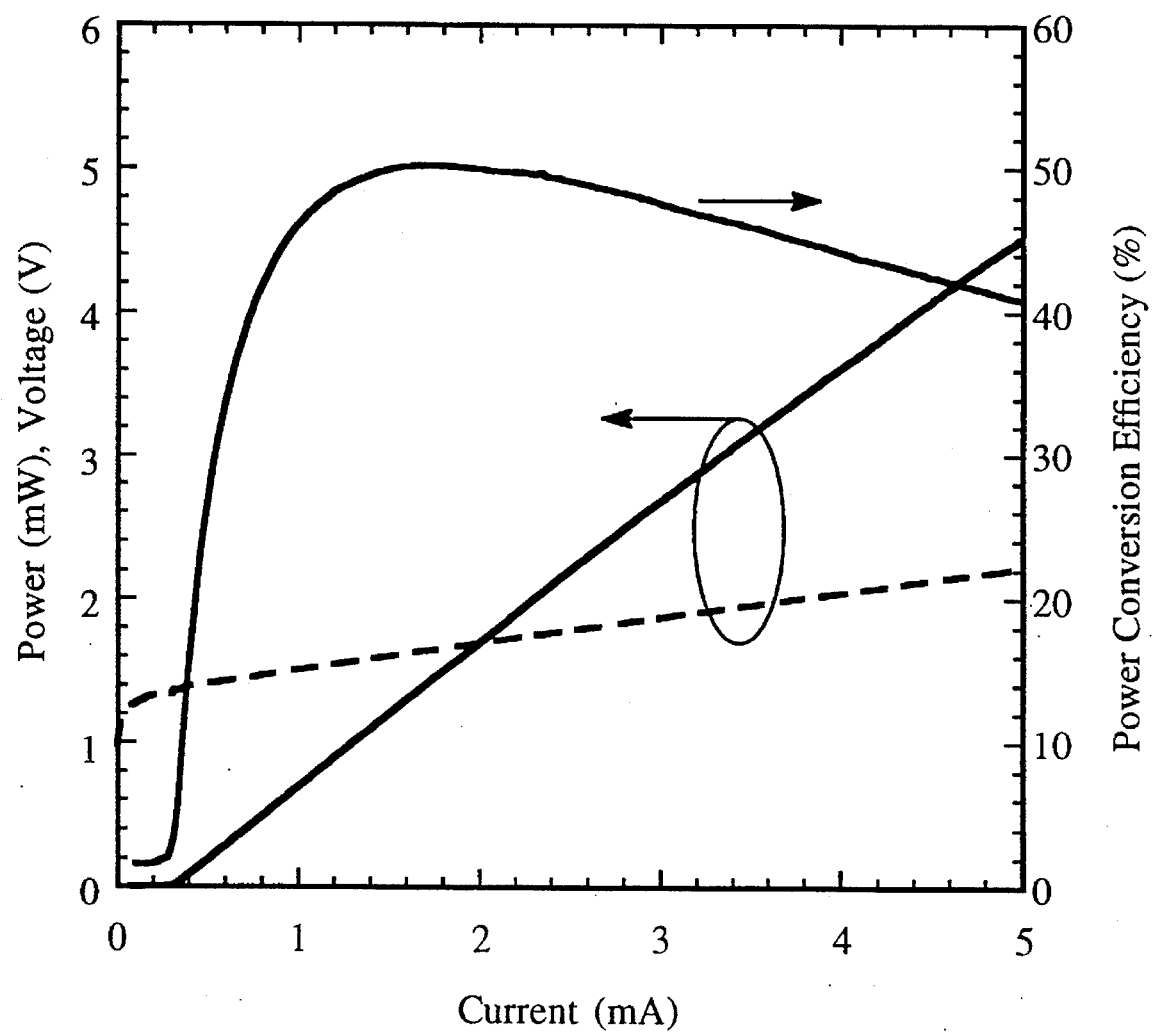
FIG. 11 shows the dependence of the operating voltage, cw light output power, and power conversion efficiency with current for a second VCSEL according to the invention having a 7 micron×7 micron light-emitting area, a threshold current of 0.35 mA, and a maximum power conversion efficiency of about 50%.

FIG. 11 shows the characteristics for a second VCSEL 10 according to the present invention. In FIG. 11, this second VCSEL with a square (7 μm×7 μm) light emitting area in the active region shows a threshold current of about 0.35 mA, and a power conversion efficiency of about 50% near 2 mA current. The lasing output power in this second VCSEL increases linearly above threshold to about 1.6 mW at about 2 mA current, and to about 4.5 mW at about 5 mA current. FIG. 11 also shows the low operating voltage for this device which is about 1.4 volts at threshold, increasing to about 2.3 volts at about 5 mA current. The combination of a low operating voltage, a low threshold voltage, and efficient light generation in the active region all contribute to the large increase in power efficiency for this VCSEL as compared to VCSELs fabricated by ion implantation.

Figure 12:
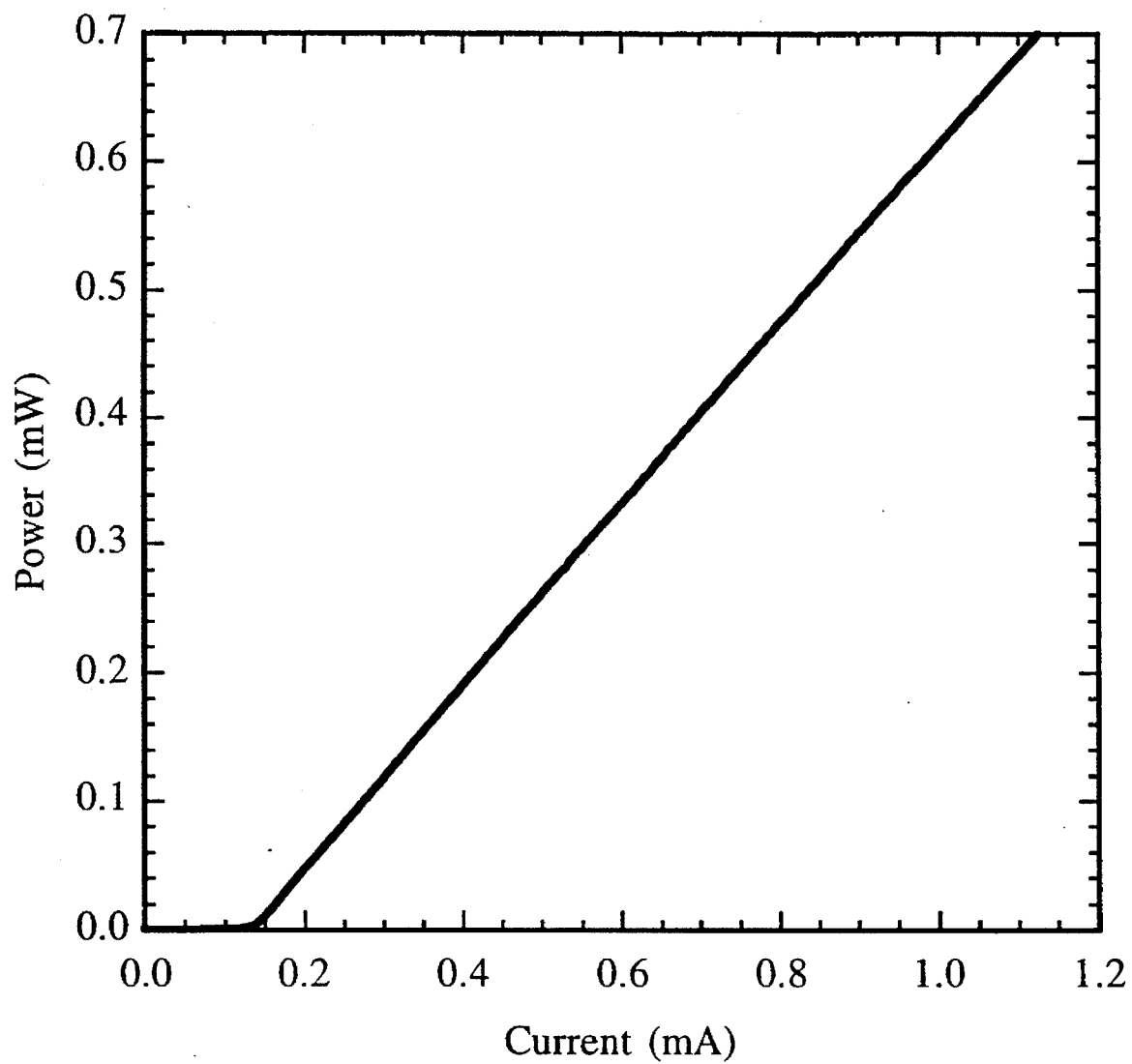
FIG. 12 shows the dependence of the light output power with current for a third VCSEL according to the invention having a 2 micron×2 micron light-emitting area, a threshold current of 0.13 mA, and a cw light output power of about 0.6 mW at 1.0 mA current.

FIG. 12 shows the lasing output power versus current for a third VCSEL 10 according to the present invention. This third VCSEL, with a 2 μm×2 μm light emitting area in the active region, has a threshold current of about 0.13 mA, and a cw lasing output power of about 0.6 mW at 1.0 milliampere current.

In the three VCSELs of FIGS. 10 to 12, the threshold current decreases with decreasing size of the light emitting area in the active region. These devices serve to show the improvement in both the electrical characteristics (i.e. threshold voltage and current) and the optical characteristics (i.e. lasing output power and power conversion efficiency) that may be realized according to the present invention.

Although the embodiments of the invention presented heretofore have been discussed as vertical-cavity surface-emitting lasers (VCSELs), each of these embodiments may also form resonant-cavity light-emitting diodes (RCLEDs) simply by reducing the number of mirror periods grown for the second stack mirror 16, thereby reducing the reflectivity of the second stack mirror and increasing the light coupled out of the resonant cavity. In this way, lasing action may be prevented in the devices while retaining a high efficiency for light generation therein.

There has thus been shown a semiconductor light-emitting device comprising on a semiconductor substrate a plurality of epitaxially-grown semiconductor layers forming a first mirror stack above the substrate, a second mirror stack above the first mirror stack, an active region between the mirror stacks, and at least one control layer proximate to the active region. The control layer is characterized by a semiconductor alloy composition and layer thickness that is different from that of any of the semiconductor layers comprising the second mirror stack. An embodiment of the invention is also described in which a control portion of the second mirror stack has at least one oxidized layer therein with a lateral oxidation extent extending laterally inward more than the oxidation extent of the semiconductor layers in the second mirror stack above the control portion.

Embodiments of the present invention have been shown and described having control layers above the active region, below the active region, and both above and below the active region. The embodiments of the invention have been described as semiconductor light-emitting devices of the vertical-cavity surface-emitting laser type and of the resonant-cavity light-emitting diode type. The matter set forth in the foregoing description and accompanying drawings is offered by way of illustration only and not as a limitation. Other applications and variations of the semiconductor light-emitting device and method will become evident to those skilled in the art. The actual scope of the invention is intended to be defined in the following claims when viewed in their proper perspective based on the prior art.

What is claimed is:

1. A semiconductor light-emitting device comprising:
   (a) a substrate;
   (b) a plurality of semiconductor layers grown on the substrate, the semiconductor layers forming a first mirror stack having a first doping type above the substrate, an active region above the first mirror stack, at least one control layer proximate to the active region and including an oxidized portion therein, and a second mirror stack above the active region and having a second doping type and further having a composition different from the non-oxidized portion of the at least one control layer;
   (c) a mesa extending downward through the semiconductor layers at least to the control layer; and
   (d) an upper electrode above the second mirror stack.

2. The semiconductor light-emitting device of claim 1 in which the oxidized portion of the control layer comprises an oxide of aluminum.

3. The semiconductor light-emitting device of claim 1 in which the control layer comprises an aluminum alloy.

4. The semiconductor light-emitting device of claim 3 in which the aluminum alloy includes at least one element selected from the group consisting of As, Ga, In, and P.

5. The semiconductor light-emitting device of claim 3 in which the aluminum alloy is $Al_xGa_{1-x}As$ with $0.8 \leq x \leq 1$.

6. The semiconductor light-emitting device of claim 3 in which the aluminum alloy has an aluminum composition higher than any aluminum composition of any of the semiconductor layers of the second mirror stack.

7. The semiconductor light-emitting device of claim 1 in which at least one of the mirror stacks includes a periodic alloy composition grading therein.

8. The semiconductor light-emitting device of claim 1 in which the active region includes cladding layers surrounding at least one quantum-well layer.

9. The semiconductor light-emitting device of claim 8 in which the quantum-well layer is comprised of a semiconductor alloy selected from the group consisting of InGaAs, GaAs, AlGaAs, AlGaInP, InGaAsP, AlGaAsP, and InAlGaAs.

10. The semiconductor light-emitting device of claim 1 in which the oxidized portion of the control layer defines a current channel into the active region.

11. The semiconductor light-emitting device of claim 1 in which the control layer defines a lateral refractive index profile for index guiding the light.

12. The semiconductor light-emitting device of claim 1 including means for defining a polarization state for the light.

13. The semiconductor light-emitting device of claim 12 in which the means for defining a polarization state for the light is an asymmetric shape of the oxidized portion of the control layer.

14. The semiconductor light-emitting device of claim 1 including means for defining a lateral mode for the light.

15. The semiconductor light-emitting device of claim 14 in which the means for defining a lateral mode for the light is an asymmetric shape of the oxidized portion of the control layer.

16. The semiconductor light-emitting device of claim 1 in which a refractive index in the oxidized portion of the control layer is substantially different from the refractive index in a central oxide-free portion of the control layer.

17. The semiconductor light-emitting device of claim 16 in which the central oxide-free portion of the control layer has an effective optical thickness that is substantially equal to a multiple of one-quarter of the wavelength of the light.

18. The semiconductor light-emitting device of claim 16 in which the oxidized portion of the control layer has an effective optical thickness that is substantially equal to a multiple of one-half of the wavelength of the light.

19. The semiconductor light-emitting device of claim 16 in which a resonant optical cavity formed by the mirror stacks has a lower Q in an off-axis portion of the cavity which includes the oxidized portion of the control layer than the Q of an on-axis portion of the cavity which does not include the oxidized portion.

20. The semiconductor light-emitting device of claim 19 in which an electric field component of the light in the off-axis portion of the cavity has a field node near at least one quantum-well in the active region.

21. The semiconductor light-emitting device of claim 20 in which the field node reduces a spontaneous emission component of the light in the off-axis portion of the cavity.

22. The semiconductor light-emitting device of claim 1 in which a first cavity resonance in an on-axis portion of a resonant optical cavity formed by the mirror stacks which does not include the oxidized portion of the control layer has a wavelength that is substantially different from the wavelength of a second cavity resonance in an off-axis portion of the cavity that includes the oxidized portion.

23. A semiconductor light-emitting device comprising:
    (a) a substrate;
    (b) a plurality of semiconductor layers grown on the substrate, the semiconductor layers forming a first mirror stack having a first doping type above the substrate, an active region above the first mirror stack, and a second mirror stack having a second doping type above the active region, at least one of the mirror stacks including a control portion therein adjacent to the active region, the control portion having at least one oxidized layer with an aluminum composition higher than any aluminum composition of any of the other semiconductor layers in the mirror stack and having a lateral oxidation extent greater than any lateral oxidation extent of the other semiconductor layers in the mirror stack;
    (c) a mesa extending downward through the semiconductor layers at least to the control portion; and
    (d) an upper electrode above the second mirror stack.

24. The semiconductor light-emitting device of claim 23 in which the oxidized layer of the control portion comprises an oxide of aluminum.

25. The semiconductor light-emitting device of claim 23 in which the oxidized layer comprises an aluminum alloy.

26. The semiconductor light-emitting device of claim 25 in which the aluminum alloy includes at least one element selected from the group consisting of As, Ga, In, and P.

27. The semiconductor light-emitting device of claim 25 in which the aluminum alloy is $Al_xGa_{1-x}As$ with $0.8 \leq x \leq 1$.

28. The semiconductor light-emitting device of claim 25 in which the aluminum alloy has an aluminum composition higher than any aluminum composition of any of the semiconductor layers of the second mirror stack.

29. The semiconductor light-emitting device of claim 23 in which at least one of the mirror stacks includes a periodic alloy composition grading therein.

30. The semiconductor light-emitting device of claim 23 in which the active region includes cladding layers surrounding at least one quantum-well layer.

31. The semiconductor light-emitting device of claim 30 in which the quantum-well layer is comprised of a semiconductor alloy selected from the group consisting of InGaAs, GaAs, AlGaAs, AlGaInP, InGaAsP, AlGaAsP, and InAlGaAs.

32. The semiconductor light-emitting device of claim 23 in which the control portion defines a current channel into the active region.

33. The semiconductor light-emitting device of claim 23 in which the control portion defines a lateral refractive index profile for index guiding the light.

34. The semiconductor light-emitting device of claim 23 including means for defining a polarization state for the light.

35. The semiconductor light-emitting device of claim 34 in which the means for defining a polarization state for the light is an asymmetric shape of the oxidized layer of the control portion.

36. The semiconductor light-emitting device of claim 23 including means for defining a lateral mode for the light.

37. The semiconductor light-emitting device of claim 36 in which the means for defining a lateral mode for the light is an asymmetric shape of the oxidized layer of the control portion.

38. The semiconductor light-emitting device of claim 23 in which a refractive index in an on axis portion of the oxidized layer including the oxidation extent is substantially different from the refractive index in a central oxide-free portion of the oxidized layer which does not include the oxidation extent.

39. The semiconductor light-emitting device of claim 38 in which the on-axis portion of the oxidized layer has an effective optical thickness that is substantially equal to a multiple of one-quarter of the wavelength of the light.

40. The semiconductor light-emitting device of claim 38 in which the off-axis portion of the oxidized layer has an effective optical thickness that is substantially equal to a multiple of one-half of the wavelength of the light.

41. The semiconductor light-emitting device of claim 38 in which a resonant optical cavity formed by the mirror stacks has a lower Q in the off-axis portion of the cavity than the Q of the on-axis portion of the cavity.

42. The semiconductor light-emitting device of claim 41 in which an electric field component of the light in the off-axis portion of the cavity has a field node near at least one quantum-well in the active region.

43. The semiconductor light-emitting device of claim 42 in which the field node reduces a spontaneous emission component of the light in the off-axis portion of the cavity.

44. The semiconductor light-emitting device of claim 23 in which a first cavity resonance in an on-axis portion of a resonant optical cavity formed by the mirror stacks which does not include the oxidation extent of the oxidized layer has a wavelength that is substantially different from the wavelength of a second cavity resonance in an off-axis portion of the cavity that includes the oxidation extent.

45. A semiconductor light-emitting device comprising:
 (a) a semiconductor substrate;
 (b) a plurality of semiconductor layers grown on the substrate, the semiconductor layers forming a first mirror stack having a first doping type above the substrate, an active region above the first mirror stack, a second mirror stack having a second doping type above the active region, and at least one control layer proximate to the active region and comprising a semiconductor alloy with an aluminum composition higher than any aluminum composition of any of the semiconductor layers of the second mirror stack;
 (c) a mesa extending downward through the semiconductor layers at least to the control layer; and
 (d) an upper electrode above the second mirror stack.

46. A semiconductor light-emitting device comprising:
 (a) a substrate;
 (b) a plurality of semiconductor layers grown on the substrate, the semiconductor layers forming a first mirror stack having a first doping type above the substrate, an active region above the first mirror stack, and a second mirror stack having a second doping type above the active region, at least one of the mirror stacks including a control portion therein adjacent to the active region, the control portion comprising a semiconductor alloy with an aluminum composition higher than any aluminum composition of any of the other semiconductor layers of the mirror stack;
 (c) a mesa extending downward through the semiconductor layers at least to the control portion; and
 (d) an upper electrode above the second mirror stack.

* * * * *